(12) United States Patent
Eid et al.

(10) Patent No.: US 11,227,859 B2
(45) Date of Patent: Jan. 18, 2022

(54) STACKED PACKAGE WITH ELECTRICAL CONNECTIONS CREATED USING HIGH THROUGHPUT ADDITIVE MANUFACTURING

(71) Applicant: Intel Corporation, Santa Clara, CA (US)

(72) Inventors: Feras Eid, Chandler, AZ (US); Johanna M. Swan, Scottsdale, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 16/651,331

(22) PCT Filed: Sep. 30, 2017

(86) PCT No.: PCT/US2017/054682
§ 371 (c)(1),
(2) Date: Mar. 26, 2020

(87) PCT Pub. No.: WO2019/066998
PCT Pub. Date: Apr. 4, 2019

(65) Prior Publication Data
US 2020/0235082 A1    Jul. 23, 2020

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4882* (2013.01); *H01L 23/3675* (2013.01);
(Continued)

(58) Field of Classification Search
CPC .................................................. H01L 21/4882
See application file for complete search history.

(56) References Cited

U.S. PATENT DOCUMENTS

2012/0068319 A1    3/2012   Choi et al.
2014/0217585 A1*   8/2014   Mallik ................... H01L 24/81
                                                          257/738
(Continued)

OTHER PUBLICATIONS

International Search Report and Written Opinion for International Patent Application No. PCT/US2017/054682 dated Feb. 28, 2018, 13 pgs.
(Continued)

*Primary Examiner* — Thao P Le
(74) *Attorney, Agent, or Firm* — Schwabe, Williamson & Wyatt, P.C.

(57) ABSTRACT

A device package and a method of forming the device package are described. The device package includes one or more dies disposed on a first substrate. The device packages further includes one or more interconnects vertically disposed on the first substrate, and a mold layer disposed over and around the first die, the one or more interconnects, and the first substrate. The device package has a second die disposed on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer. The device package may include one or more interconnects having one or more different thicknesses or heights at different locations on the first substrate.

25 Claims, 26 Drawing Sheets

(51) Int. Cl.
*H01L 23/367* (2006.01)
*H01L 25/00* (2006.01)

(52) U.S. Cl.
CPC ...... *H01L 25/50* (2013.01); *H01L 2225/1035* (2013.01); *H01L 2225/1058* (2013.01)

(56) References Cited

U.S. PATENT DOCUMENTS

| | | | |
|---|---|---|---|
| 2014/0217610 A1* | 8/2014 | Jeng | H01L 23/49827 257/774 |
| 2015/0303174 A1 | 10/2015 | Yu et al. | |
| 2016/0358831 A1 | 12/2016 | Corisis et al. | |
| 2017/0105311 A1 | 4/2017 | Pillans et al. | |
| 2017/0207205 A1 | 7/2017 | Kim et al. | |
| 2017/0278825 A1* | 9/2017 | Lakhera | H01L 21/565 |
| 2019/0377392 A1* | 12/2019 | Mani | G06F 1/203 |
| 2019/0385977 A1* | 12/2019 | Elsherbini | H01L 25/50 |
| 2020/0105719 A1* | 4/2020 | Li | H01L 25/0652 |
| 2021/0074645 A1* | 3/2021 | Tsai | H01L 25/50 |

OTHER PUBLICATIONS

International Preliminary Report on Patentability for International Patent Application No. PCT/US2017/054682, dated Apr. 9, 2020, 10 pgs.

* cited by examiner

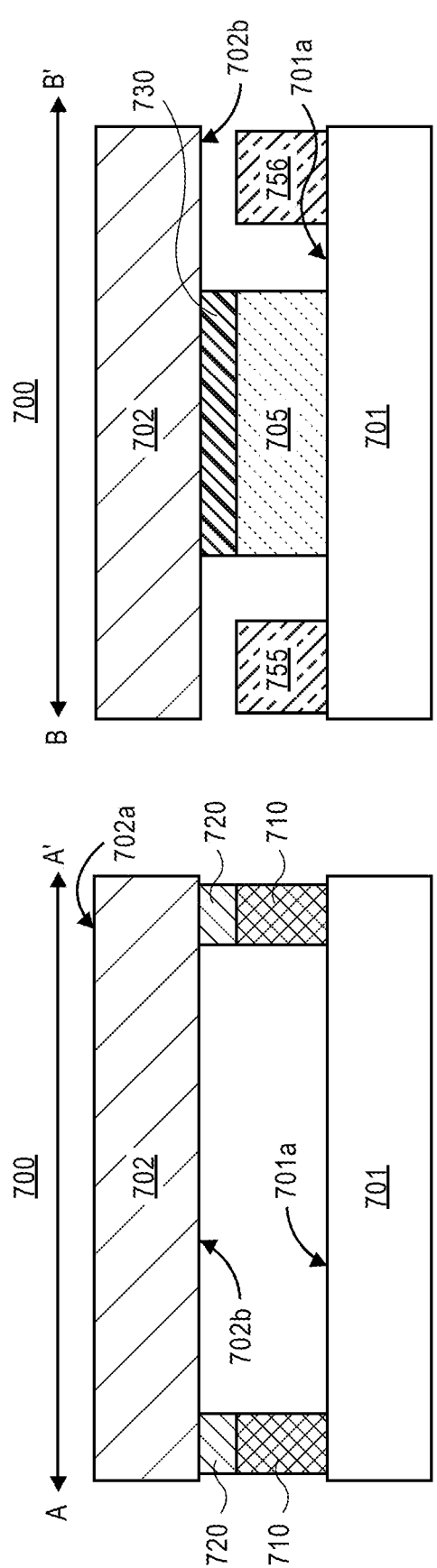
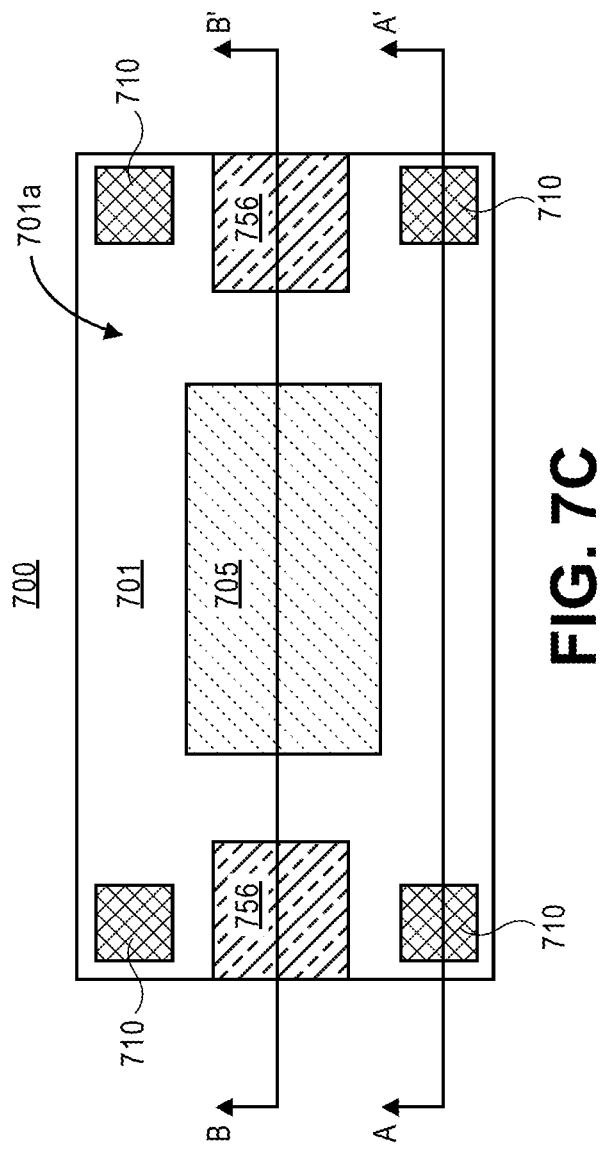
FIG. 7A
FIG. 7B
FIG. 7C

STACKED PACKAGE WITH ELECTRICAL CONNECTIONS CREATED USING HIGH THROUGHPUT ADDITIVE MANUFACTURING

CROSS-REFERENCE TO RELATED APPLICATION

This patent application is a U.S. National Phase Application under 35 U.S.C. § 371 of International Application No. PCT/US2017/054682, filed Sep. 30, 2017, entitled "STACKED PACKAGE WITH ELECTRICAL CONNECTIONS CREATED USING HIGH THROUGHPUT ADDITIVE MANUFACTURING," which designates the United States of America, the entire disclosure of which is hereby incorporated by reference in its entirety and for all purposes.

FIELD

Embodiments relate to semiconductor devices. More particularly, the embodiments relate to packaging semiconductor devices with substrate integrated posts and integrated heat spreader customization using high throughput additive manufacturing for enhanced package thermomechanics; semiconductor devices with a highly conductive layer deposited on dies using high throughput additive deposition; and semiconductor devices with one or more interconnects (or vias) disposed between stacked packages and/or dies using high throughput additive deposition.

BACKGROUND

Packaging semiconductor devices presents several challenges. One such challenge is encountered with small form factor (SFF) packages and systems-in-packages (SiPs). These packages, for example, are used in Internet of Things (IoT) devices, wearables, and mobile products that demand high-levels of integration in a very small footprint as the printed circuit board (PCB) space is limited. In addition, these packages also require integration of heterogeneous components of varying sizes.

For these SFF packages and SiPs, packaging solutions may use a traditional package-on-package (POP) approach. In a traditional POP architecture, the components in a bottom package are connected to a top package using through-mold vias (TMVs) that are filled with solder or copper-plated. Alternatively, packaging solutions may use discrete peripheral interposers with through vias. These approaches, however, present additonal problems and limitations.

For example, the POP approach with solder-filled TMVs typically requires ball drop and suffers from aspect-ratio limitations due to the spherical shape of the solder ball (before reflow). Copper-plated TMVs typically require multiple resist lamination steps, lithography, and then a time-consuming plating step to produce the required via thicknesses (i.e., roughly 100 um or more), thus leading to an expensive manufacturing process with relatively slow throughput. Meanwhile, interposers with through vias typically increase the overall package size and require additional pick and place (PnP) assembly steps.

Moreover, packaging semiconductor devices with integrated heat spreaders (IHS) or lids also presents several problems. One such problem in multi chip packages (MCPs) is that the lid typically bottoms out on one of the semiconductor chips or dies that are assembled on the package, achieving the lowest possible thermal interface material (TIM) bondline thickness (BLT) and lowest TIM thermal resistance above that die while producing larger TIM BLT and higher TIM thermal resistance above other chips or die in the package.

For thermal management, packaging solutions may use polymer thermal interface material (PTIM) between the dies and the lid (or IHS). While the thermal performance of PTIMs is sufficient in some segments, new high power segments are emerging which require TIMs with lower thermal resistance (e.g., solder TIM). One problem with using solder TIM (STIM) is that it does not wet bare silicon (Si) and thus requires die backside metallization (BSM), which increases the complexity and cost of the backend fabrication process by requiring the deposition of titanium gold (Ti/Au) on the wafer prior to singulation. Likewise, other types of TIMs with higher conductivity than PTIM, such as high metal filler epoxy TIM or sinterable paste, have poor adhesion to polished Si and require surface functionalization or treatment of the Si to be used effectively.

BRIEF DESCRIPTION OF THE DRAWINGS

Embodiments described herein are illustrated by way of example and not limitation in the figures of the accompanying drawings, in which like references indicate similar features. Furthermore, some conventional details have been omitted so as not to obscure from the inventive concepts described herein.

FIGS. 7A and 7B are cross-sectional views of a semiconductor package having a lid, one or more dies, one or more die-side capacitors (DSCs), one or more posts, and a substrate, according to one embodiment. FIG. 7C is a corresponding plan view of the semiconductor package without the lid, according to one embodiment.

DETAILED DESCRIPTION

Figure 1A:
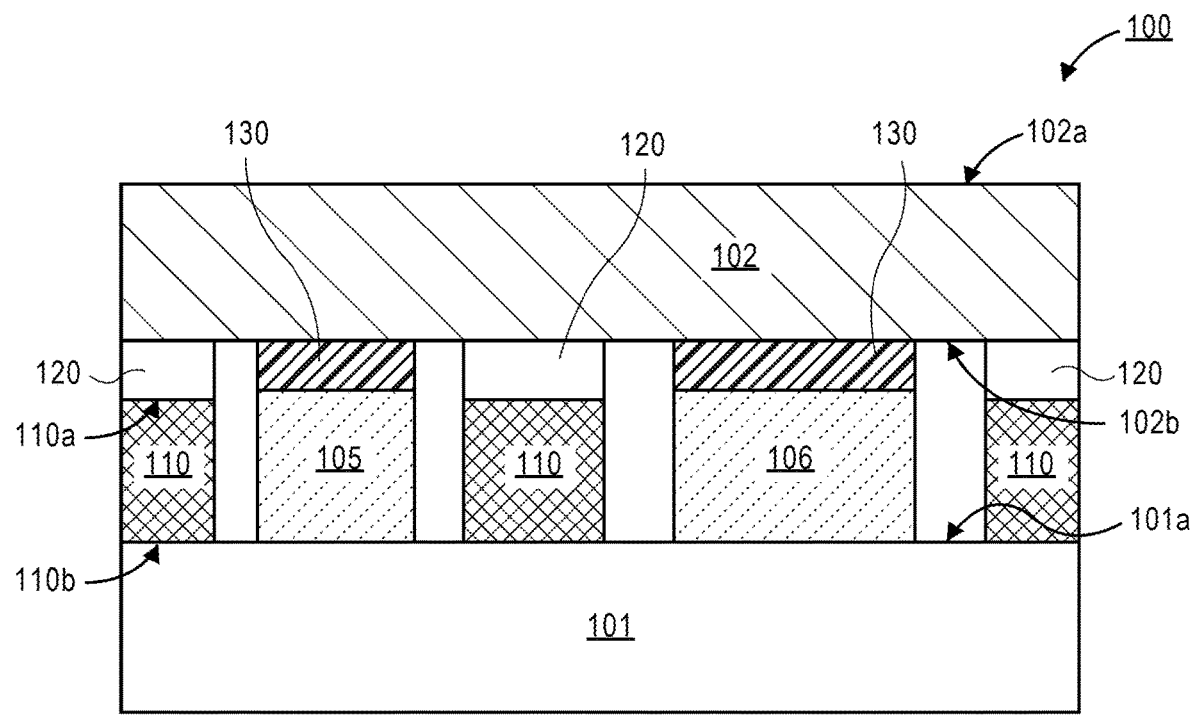
FIG. 1A is a cross-sectional view of a semiconductor package having a lid, one or more dies, one or more posts, and a substrate, according to one embodiment.

Described below are ways for forming semiconductor devices (or packages) with substrate integrated posts, integrated heat spreaders, highly conductive layers deposited on dies, and electrical interconnects (or vias). Specifically, the semiconductor packages described herein include substrate integrated posts and integrated heat spreaders that are customized using high throughput additive manufacturing (AM) for enhanced package thermomechanics. Additionally, the semiconductor packages described herein may also include forming highly conductive layers on one or more dies using high throughput additive deposition (e.g., a cold spray (CS) process). Likewise, the semiconductor packages described herein also include disposing one or more AM interconnects between stacked packages and/or dies using high throughput additive deposition.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

The present embodiments may include substrate integrated posts, integrated heat spreaders, and/or highly conductive layers formed using CS process that enhance packaging solutions. For example, as described herein, the present embodiments help to solve the problems of dealing with complex lid designs for each and every package (especially in multi-chip packages (MCPs)) and address thermal and reliability issues. Likewise, the present embodiments also enable new architectures and processes that allow the use of solder thermal interface materials (STIMs) and other novel or non-standard thermal interface materials (TIMs) for improved thermal management, binning, and performance over polymer TIM (PTIM), while eliminating the need for traditional wafer-level backside metallization (BSM) to enable wettability or special surface functionalization to improve adhesion.

According to some embodiments, the semiconductor packages (also referred to as device packages) facilitate packaging solutions by providing (i) a main universal lid (e.g., a flat lid or a large lid with legs only on its outer periphery) that may only be dependent on package size (hence has the same design for different packages of the same size) and may be manufactured/assembled using a standard direct lid attach (DLA) process (e.g., stamping); and (ii) one or more posts (or frames) surrounding each die, integrated with and disposed on the substrate, and mechanically coupled to the main lid (e.g., using an adhesive layer).

The present embodiments further enhance packaging solutions by enabling a cost-efficient solution that allows a single universal lid design and varying TIM materials to be used across multiple platforms and technologies. In particular, some of the advantages of the present embodiments include: (i) a discrete stiffener and its associated assembly steps are not needed as the posts are manufactured using substrate or panel level manufacturing processes; (ii) stronger mechanical coupling between the substrates and posts leading to lower thermomechanical stresses between the dies and flat lid edges and thus improved TIM thermal performance and reliability; (iii) improved flexibility to create multiple separate posts instead of being limited to a single connected picture frame design (note that this is especially advantageous as it allows the optimization of the post designs for thermomechanical performance, while minimizing the area the posts occupy on the substrate and thus increasing the substrate area for other components (e.g., additional die, die-side capacitors, etc.)); (iv) the flexibility to form the posts from one or more different materials (e.g., metals, metal alloys, metal/ceramic composites, polymers, polymer-metal, polymer-ceramic composites, etc.) rather than being limited to metal (e.g., stainless steel or Cu) that is typically used to form discrete stiffeners; (v) a reduction of the die overhang by creating posts that are near each die, thus reducing warpage, TIM stress, and TIM degradation during reliability testing; (vi) customization features/components on the universal lid using high throughput AM; and (vii) a cost-efficient process that allows the use of low-cost lids with standard (universal) designs which can then be customized with AM steps (e.g., depositing and forming the custom lid features and/or posts, at a faster rate, with their desired differentiating features in a single-step using a single equipment), and also allows great flexibility in terms of material selections and patterns.

According to some embodiments, FIGS. 1-8 illustrate semiconductor packages that include substrates with one or more integrated posts for enhanced thermomechanics.

Figure 1B:
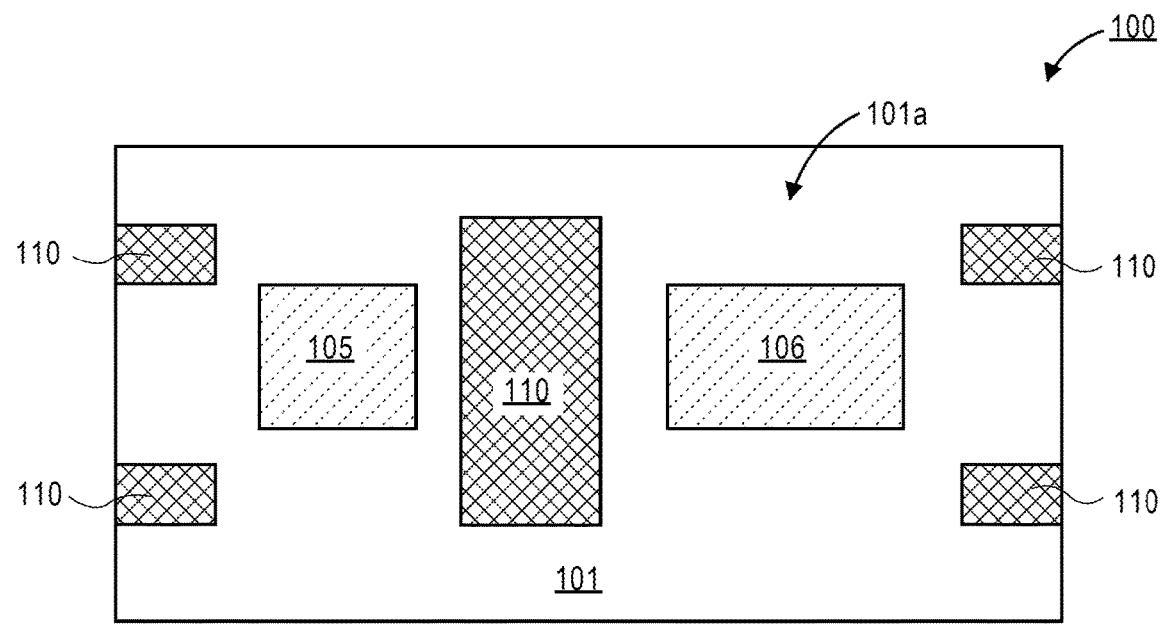
FIG. 1B is a corresponding plan view of the semiconductor package without the lid, according to one embodiment.

FIG. 1A illustrates a cross-sectional view of a semiconductor package 100. For one embodiment, the semiconductor package 100 has a lid 102, one or more dies 105-106, posts 110, and a substrate 101. Correspondingly, FIG. 1B shows a plan view of the semiconductor package 100—with the lid 102 omitted in this view—having the dies 105-106 and posts 110 disposed on a top surface 101a of the substrate 101, according to one embodiment.

As used herein, a "post" (also referred to as a substrate integrated post) refers to a structure or frame directly disposed on a substrate—without the use of any adhesive layer—where the post may be adjacent to or surround one or more dies on the substrate. For example, one or more posts (e.g., posts 110 of FIG. 1A) may be customized for each die and package to provide the necessary mechanical characteristics needed to avert thermal and reliability issues. In addition, according to some embodiments, the posts may be used with a main/single universal lid (e.g., lid 102 of FIG. 1A) that may be shared across multiple packages and technologies. That is, for some embodiments, the posts are formed using substrate or panel-level processes and are thus customized for each package design to optimize the package's thermomechanical response, while allowing the same universal lid to be attached to the posts and used across different devices/products. This simplifies the lid design and assembly processes and ensures that the thermal and reliability issues are addressed by incorporating the posts.

Referring now to FIG. 1A, a semiconductor package 100 (also referred to as a device package) has a plurality of posts 110 disposed on a top surface 101a of a substrate 101. For one embodiment, each post 110 has a top surface 110a and a bottom surface 110b that is opposite from the top surface 110a. According to some embodiments, the semiconductor package 100 also has one or more dies 105-106 disposed on the top surface 101a of the substrate 100. For some embodiments, the one or more dies 105-106 are located adjacent to (or surrounding) the posts 110 on the substrate 101. According to some embodiments, a lid 102 is disposed above the posts 110 and the dies 105-106 on the substrate 100, where the lid 102 has a top surface 102a and a bottom surface 102b that is opposite from the top surface 102a. Additionally, an adhesive layer 120 may be disposed on the top surface 110a of each post 110, where the adhesive layer 120 attaches (or couples) the bottom surface 102b of the lid 102 and the top surfaces 110a of the posts 110 (i.e., the adhesive layer 120 forms a mechanical coupling between the posts 110 and the lid 102).

According to some embodiments, the substrate 101 may include, but is not limited to, a package, a substrate, and a printed circuit board (PCB). For one embodiment, the substrate 101 is a PCB. For one embodiment, the PCB is made of an FR-4 glass epoxy base with thin copper foil laminated on both sides (not shown). For certain embodiments, a multilayer PCB can be used, with pre-preg and copper foil (not shown) used to make additional layers. For example, the multilayer PCB may include one or more dielectric layers, where each dielectric layer can be a photosensitive dielectric layer (not shown). For some embodiments, holes (not shown) may be drilled in substrate 101. For one embodiment, the substrate 101 may also include conductive copper traces, metallic pads, and holes (not shown).

For one embodiment, each of the one or more dies 105-106 includes, but is not limited to, a semiconductor die, an integrated circuit, a CPU, a microprocessor, and a platform controller hub (PCH). Note that each of the dies 105-106 may be similar dies or differ in size (e.g., having varying z-heights or areas). For some embodiments, the dies 105-106 may be disposed adjacent to the posts 110. For example, a post (or posts) may surround one or more dies (as shown in FIGS. 1A-1B, 3A-3B, and 4-7), or the post (or posts) may be between the dies (as shown in FIGS. 1A-1B, 2A-2B, and 4-6).

Figure 2A:
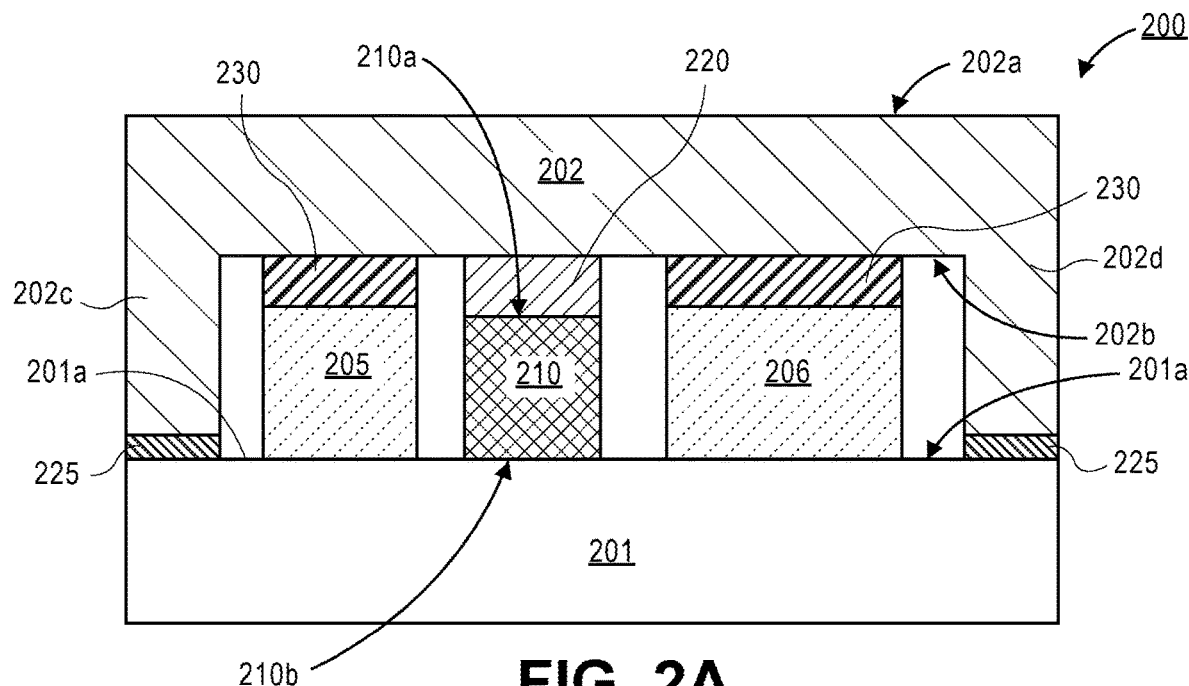
FIG. 2A is a cross-sectional view of a semiconductor package having a lid, one or more dies, a post, and a substrate, according to one embodiment.
Figure 2B:
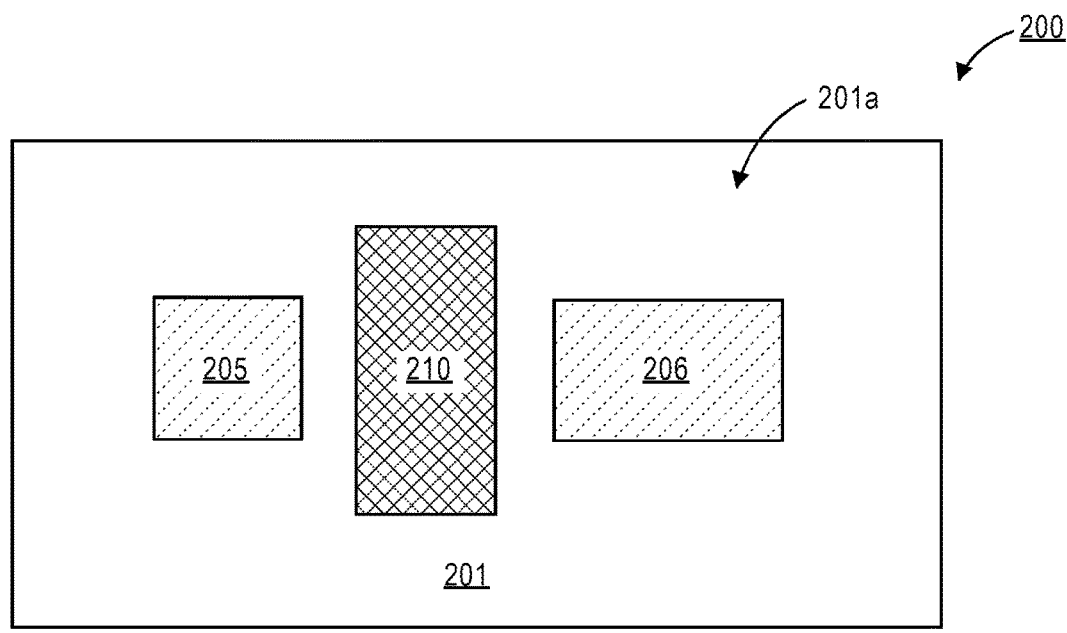
FIG. 2B is a corresponding plan view of the semiconductor package without the lid, according to one embodiment.

According to some embodiments, the lid 102 may be formed as a flat lid with no legs or a lid with legs on the outer periphery of the lid (as shown in FIGS. 2A-2B). For example, the lid 102 may be formed based on the desired package size (i.e., has the same design for different packages of the same size) and assembled using a standard DLA process. For one embodiment, as shown in FIG. 1A, the lid 102 is a flat lid that is coupled to the posts 110 on the substrate 101 using an adhesive layer 120, thus reducing the thermomechanical stresses in TIM 130 at the edges of the dies 105-106 (compared to using a standard lid (or IHS) with monolithic legs). The lid 102 may be formed from a thermally conductive material, such as metal. For example, the lid 102 may be formed from at least one of copper, aluminum, steel, nickel, any other metal, a metal alloy, any other conductive material, or any combination thereof.

For one embodiment, the adhesive layer 120 may be used to couple (mechanically and/or thermally) the posts 110 and the lid 102, where the adhesive layer 120 may be formed on the top surface 110a of each post 110. The adhesive layer 120 may be formed with an epoxy material or any compliant adhesive. For some embodiments, one or more TIMs 130 may be formed on the dies 105-106 and couple the dies 105-106 to the bottom surface 102b of the lid 102 thermally and/or mechanically. The TIMs 130 (or TIM layers) may include, but are not limited to, a PTIM, an epoxy, a liquid phase sintering (LPS) paste, a solder paste or TIM, any other TIM material, or any combination thereof. For one embodiment, a thickness or BLT of the TIM 130 on die 105 may be equal or substantially equal to a thickness or BLT of TIM 130 on die 106. For another embodiment, a thickness or BLT of the TIM 130 on die 105 may be different from a thickness or BLT of TIM 130 on die 106 (i.e., in addition to their heat dissipation functions, the TIMs 130 may be used to compensate for a z-height variation in one or more dies).

According to some embodiments, the posts 110 are disposed (and/or formed) on the substrate 101. For example, the posts 110 may be integrated with, and manufactured onto the substrate 101 and mechanically coupled to the lid 102 with the adhesive layer 120. The posts 110 may be formed to have one or more different shapes, such as a picture frame, a separator, a round pillar, an H or I shape, etc. The posts 110 may be formed using materials such as metals (e.g., copper (Cu), aluminum (Al), titanium (Ti), nickel (Ni), etc.), metal alloys (e.g., stainless steel), metal/ceramic composites (e.g., Cu/diamond, Cu/alumina), and/or any combination thereof.

For some embodiments, the posts 110 can be created on the substrate 101 at the panel or unit level. In addition, the posts 110 may be formed with one or more different materials, including metals, metal alloys, and/or metal/ceramic composites. For one embodiment, the posts 110 may be formed using AM methods, such as cold spray. For example, to form the posts 110, powders of the one or more materials to be deposited/formed are accelerated through a nozzle at high speeds, forming a mechanical bond upon impact with the top surface 101a of the substrate 101. Patterning can be achieved by controlling the nozzle dimensions and movement, and/or by spraying the powders through a shadow mask (not shown) with the desired features and/or shapes. Note that this approach allows flexibility in material choice as multiple material powders can be combined and used to form posts (e.g., posts 110 of FIG. 1A) with the desired thermomechanical properties. For another embodiment, the posts 110 may be formed only with metals by using standard substrate manufacturing methods (e.g., semi-additive manufacturing).

For other embodiments, the posts 110 may be formed with polymers, polymer-metals, and/or polymer-ceramic composites (e.g., metal-filled or ceramic-filled polymers or resins, epoxy molding compounds, etc.), which may be patterned to the desired shape using dispensing or molding (e.g., compression molding). For alternative embodiments, the posts 110 may also be formed with one or more layers of different materials (e.g., epoxy, metal, ceramic, nanocrystalline powders, etc.), which may be produced/formed through any of the processes described herein (or in which some of the layers are picked and placed as discrete components).

Note that the semiconductor package 100, as shown in FIG. 1A, may include fewer or additional packaging components based on the desired packaging design.

Referring now to FIG. 1B, a top view of the semiconductor package 100 is shown without a lid (e.g., lid 102 of FIG. 1A), an adhesive layer (e.g., adhesive layer 120 of FIG. 1A), and a TIM layer (e.g., TIMs 130 of FIG. 1A). As shown in FIG. 1B, the one or more dies 105-106 are disposed on the top surface 101a of the substrate 101 and surrounded by the one or more posts 110.

The posts 110 are formed with two shapes: four small rectangular posts 110 are located on the outer periphery (or edges) of the substrate 101, and a large rectangular post 110 (also referred to as a large separator post) is located between both dies 105-106 on the substrate 101. For other embodiments, the posts 110 may have other shapes and sizes such as picture frame posts, squared-shaped posts, L-shaped corner posts (or L-shaped posts), round pillars, multiple smaller separators (rather than a large separator), H-shaped separator posts (or H-shaped posts), T-shaped separator posts (or T-shaped posts), and/or any combination thereof. The posts 110 may have a similar (or equal) surface area or different surface areas (and different z-heights), depending on the desired thermomechanical properties and/or package design.

Note that the semiconductor package 100, as shown in FIG. 1B, may include fewer or additional packaging components based on the desired packaging design.

FIG. 2A is a cross-sectional view of a semiconductor package 200 having a lid 202, one or more dies 205-206, a post 210, and a substrate 201, according to one embodiment. FIG. 2B is a corresponding plan view of the semiconductor package 200 without the lid 202, according to one embodiment. Note that the semiconductor package 200 of FIGS. 2A and 2B is similar to the semiconductor package 100 of FIGS. 1A and 1B, however the semiconductor package 200 has the lid 202 with legs 202c-d on the outer periphery of the substrate 201.

Referring now to FIG. 2A, the semiconductor package 200 has the post 210 disposed on a top surface 201a of the substrate 201. For one embodiment, the post 210 has a top surface 210a and a bottom surface 210b. The semiconductor package 200 further includes dies 205-206 disposed on the top surface 201a of the substrate 201. As shown in FIG. 2A, the dies 205-206 are located adjacent to the post 210 on the substrate 201. The lid 202 may be disposed above the post 210 and the dies 205-206 on the substrate 201, where the lid 202 has a top surface 202a and a bottom surface 202b. Additionally, an adhesive layer 220 may be disposed on the top surface 210a of the post 210, where the adhesive layer 220 is formed between the bottom surface 202b of the lid 202 and the top surface 210a of the post 210.

For one embodiment, the post 210 may be formed as a large rectangular separator between the dies 205-206. For other embodiments, the post 210 may have other shapes and sizes, such as one or more smaller separator posts with a round shape, L-shape, T-shape, H-shape, and/or any combination thereof. For some embodiments, the lid 202 may be formed as a flat lid having legs 202c-d on the outer periphery of the lid 202. For example, the legs 202c-d of the lid may be formed to have one or more different shapes, where the legs 202c-d may include rectangular shapes located on the edges of the lid 202, a picture frame shape on the outer edges of the lid 202 (e.g., coupling both legs 202c-d), round pillars located on the edges of the lid 202, L-shaped corners on the lid 202, or any desired shape and size. For one embodiment, the lid 202 may be coupled to the post 210 on the substrate 201 using the adhesive layer 220.

According to some embodiments, the lid 202 may be coupled to the substrate 201 with a sealant 225 (also referred to as a sealant layer). For one embodiment, the sealant 225 is formed between the top surface 201a of the substrate and the bottom surfaces of the legs 202c-d. For some embodiments, the sealant 225 may provide some degree of thermal coupling between the lid 202 and the substrate 201, but the sealant's 225 main function is to provide a structural or mechanical coupling between the lid 202 and the substrate 201. The sealant 225 may be formed from an adhesive material that contains thermally conductive particles, a silicone-based sealant material, an epoxy-based sealant material, or any other sealant materials known in the art.

For some embodiments, one or more TIMs 230 may be formed on the dies 205-206 and couple the dies 205-206 to the bottom surface 202b of the lid 202 thermally and/or mechanically. For one embodiment, the BLT of the TIM 230 on die 205 may be equal or substantially equal to the BLT of TIM 230 on die 206. For another embodiment, the BLT of the TIM 230 on die 205 may be different from the BLT of TIM 230 on die 206 (e.g., when the dies have different z-heights).

According to some embodiments, the post 210 is disposed on the top surface 201a of the substrate 201. For example, the post 210 may be integrated with, and manufactured onto the substrate 201 and mechanically coupled to the lid 202 with the adhesive layer 220. For some embodiments, the post 210 may be formed as a large rectangular separator or multiple smaller separators between the dies 205-206.

Note that the semiconductor package 200, as shown in FIG. 2A, may include fewer or additional packaging components based on the desired packaging design.

Referring now to FIG. 2B, a top view of the semiconductor package 200 is shown without a lid (e.g., lid 202 of FIG. 2A), an adhesive layer (e.g., adhesive layer 220 of FIG. 2A), a sealant layer (e.g., sealant 225 of FIG. 2A), and a TIM layer (e.g., TIMs 230 of FIG. 2A). As shown in FIG. 2B, the dies 205-206 are disposed on the top surface 201a of the substrate 201 and adjacent to the post 210.

Note that the semiconductor package 200, as shown in FIG. 2B, may include fewer or additional packaging components based on the desired packaging design.

Figure 3A:
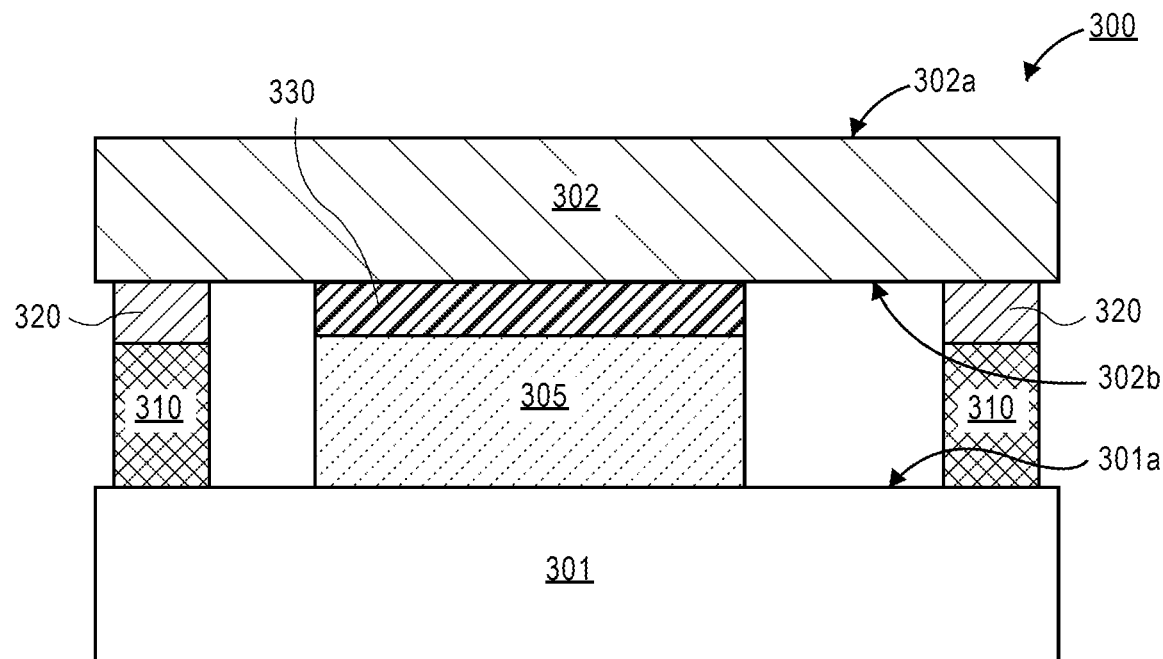
FIG. 3A is a cross-sectional view of a semiconductor package having a lid, a die, one or more posts, and a substrate, according to one embodiment.
Figure 3B:
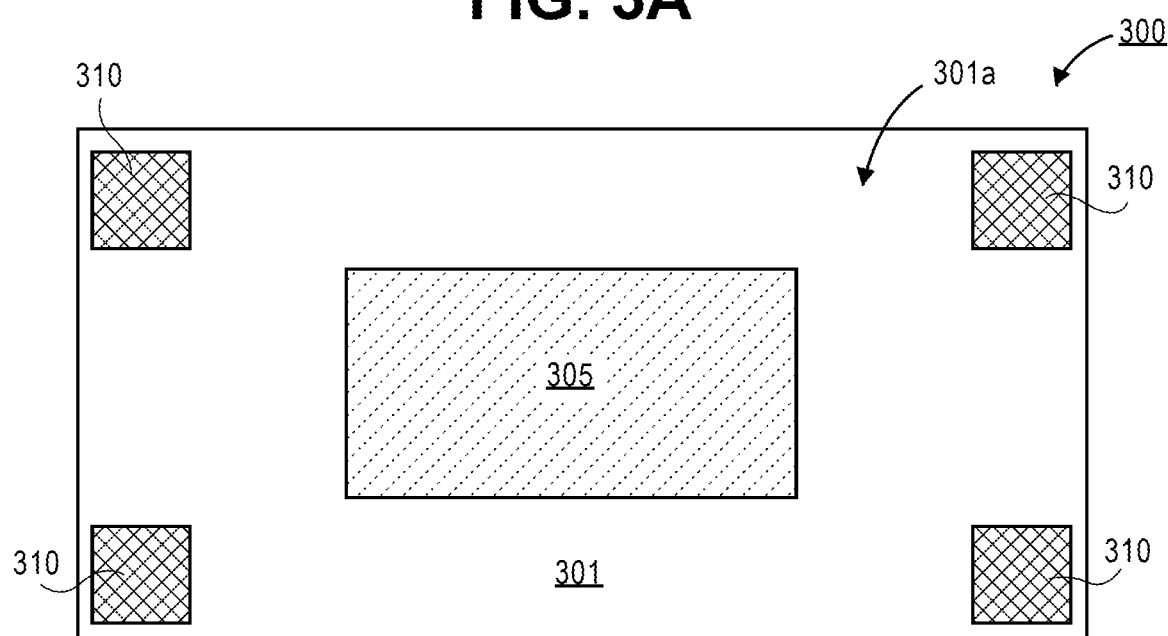
FIG. 3B is a corresponding plan view of the semiconductor package without the lid, according to one embodiment.

FIG. 3A is a cross-sectional view of a semiconductor package 300 having a lid 302, a die 305, one or more posts 310, and a substrate 301, according to one embodiment. FIG. 3B is a corresponding plan view of the semiconductor package 300 without the lid 302, according to one embodiment. Note that the semiconductor package 300 of FIGS. 3A and 3B is similar to the semiconductor packages 100 of FIGS. 1A and 1B and 200 of FIGS. 2A and 2B, however the semiconductor package 300 includes a single die 305.

Referring now to FIG. 3A, the semiconductor package 300 has the posts 310 disposed on a top surface 301a of the substrate 301. For one embodiment, each of the posts 310 has a top surface 310a and a bottom surface 310b. The semiconductor package 300 further includes the die 305 disposed on the top surface 301a of the substrate 301. As shown in FIG. 3A, the die 305 is surrounded with the posts 310 and located roughly on a central region of the substrate 301. The lid 302 may be disposed above the posts 310 and the die 305 on the substrate 301, where the lid 302 has a top surface 302a and a bottom surface 302b. Additionally, an adhesive layer 320 may be disposed on the top surface 310a of the posts 310, where the adhesive layer 320 is formed between the bottom surface 302b of the lid 302 and the top surfaces 310a of the posts 310.

For one embodiment, the posts 310 may be formed as one or more rectangles (or squares) on the outer edges of the substrate 301 and surrounding the die 305. For example, the lid 302 may be a flat lid that is coupled to the posts 310 on the substrate 301 with the adhesive layer 320, such that the thermomechanical stresses in TIM 330 at the edges of die 305 are reduced.

For some embodiments, the TIM 330 may be formed on the die 305, coupling the die 305 to the bottom surface 302b of the lid 302 thermally and/or mechanically. For one embodiment, the BLT of the TIM 330 on die 305 may be equal or substantially equal to the BLT of the adhesive layer 320. For another embodiment, the BLT of the TIM 330 may be different than the BLT of the adhesive layer 320 (e.g., where the different BLTs of the TIM and adhesive layer may be accommodating for the difference in z-height between the die 305 and the posts 310).

Note that the semiconductor package 300, as shown in FIG. 3A, may include fewer or additional packaging components based on the desired packaging design.

Referring now to FIG. 3B, a top view of the semiconductor package 300 is shown without a lid (e.g., lid 302 of FIG. 3A), an adhesive layer (e.g., adhesive layer 320 of FIG. 3A), and a TIM layer (e.g., TIM 330 of FIG. 3A). As shown in FIG. 3B, the die 305 has a large surface area and is disposed on the top surface 301a of the substrate 301. For one embodiment, the die 305 is surrounded by posts 310 formed on each corner of the substrate 301.

Note that the semiconductor package 300, as shown in FIG. 3B, may include fewer or additional packaging components based on the desired packaging design.

Figure 4:
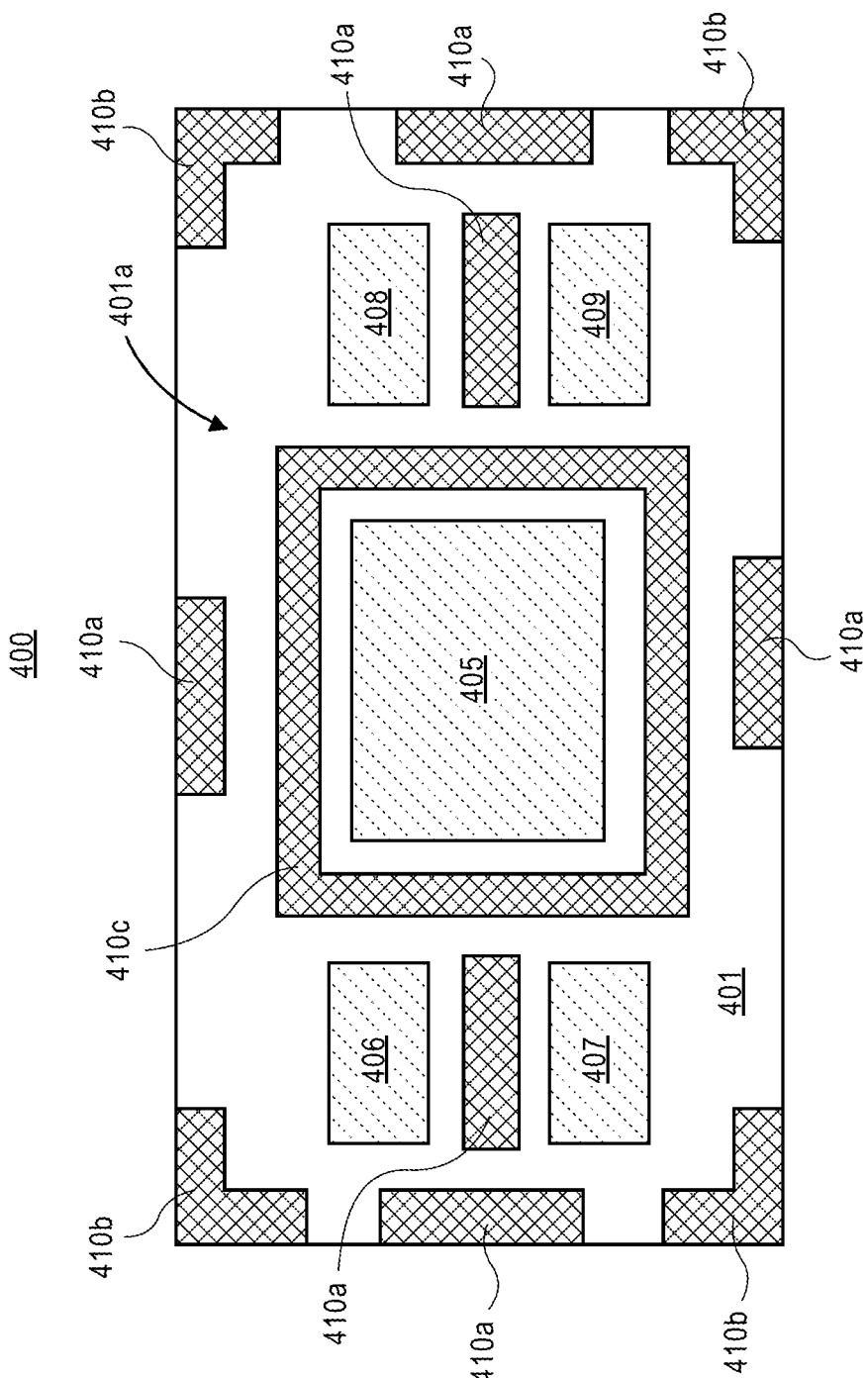
FIGS. 4-6 are plan views of semiconductor packages with one or more dies and one or more posts, according to some embodiments.
Figure 5:
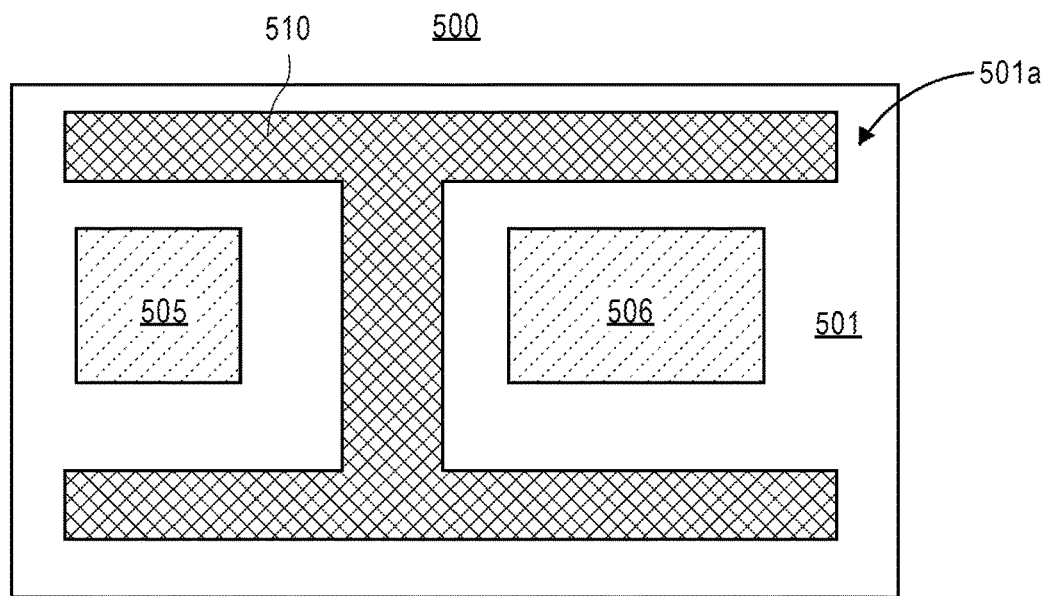
Figure 6:
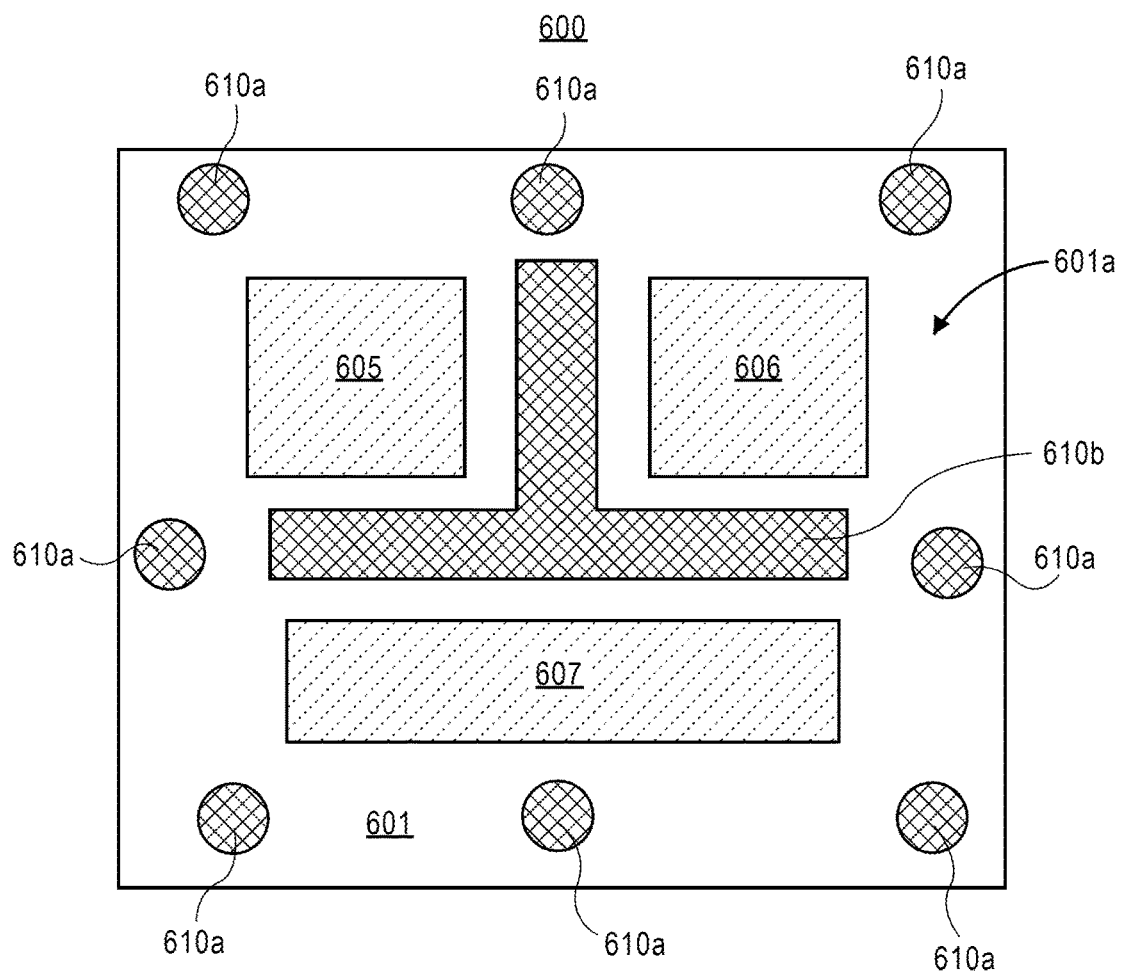

FIGS. 4-6 are plan views of semiconductor packages 400, 500, and 600, accordingly, where the views do not include a lid, an adhesive layer, and a TIM layer, according to some embodiments. Note that the semiconductor packages 400, 500, and 600 of FIGS. 4-6 are similar to the semiconductor packages 100 of FIGS. 1A and 1B, 200 of FIGS. 2A and 2B, and 300 of FIGS. 3A and 3B.

Referring now to FIG. 4, the semiconductor package 400 has one or more dies 405-409 and one or more posts 410a-c disposed on a top surface 401a of a substrate 401. For some embodiments, the posts 410a-c may have one or more different shapes that may be used for different packages to optimize each package's thermomechanical performance. For example, the posts 410a-c may include four L-shaped corner posts 410b, six rectangular posts 410a, and a picture frame post 410c. For some embodiments, the posts 410a-c may be adjacent to or surround one or more of the dies 405-409.

For one embodiment, the posts 410a-c may be formed using AM methods, such as cold spray. For example, the patterning of posts 410a-c can be achieved by controlling the nozzle dimensions and movement, and/or by spraying the one or more powder materials through a shadow mask (not shown) to form the respective shapes (or any other desired features and/or shapes as shown in FIGS. 5-6).

Note that the semiconductor package 400 may include fewer or additional packaging components based on the desired packaging design.

Referring now to FIG. 5, the semiconductor package 500 has one or more dies 505-506 and a post 510 disposed on a top surface 501a of a substrate 501. For some embodiments, the post 510 may be an H-shaped separator post. As such, the post 510 is adjacent to and surrounds the one or more dies 505-506.

Note that the semiconductor package 500 may include fewer or additional packaging components based on the desired packaging design.

Referring now to FIG. 6, the semiconductor package 600 has one or more dies 605-607 and one or more posts 610a-b disposed on a top surface 601a of a substrate 601. For some embodiments, the posts 610a-b may have one or more different shapes, including eight round pillar posts 610a located on the periphery of the substrate 601a and a T-shaped separator post 610b. For some embodiments, the posts 610a-b may be adjacent to and/or surround the dies 605-607, where the post 610b may separate each of the dies 605-607 from one another.

Note that the semiconductor package 600 may include fewer or additional packaging components based on the desired packaging design.

FIG. 7A is a cross-sectional view of a semiconductor package 700 along the A-A' axis. FIG. 7B is a corresponding cross-sectional view of the semiconductor package 700 along the B-B' axis. FIG. 7C is a corresponding plan view of the semiconductor package 700, illustrating both the A-A' axis and B-B' axis. Note that the semiconductor package 700 of FIGS. 7A-7C is similar to the semiconductor packages 100 of FIGS. 1A-1B, 200 of FIGS. 2A-2B, 300 of FIGS. 3A-3B, and 400, 500, and 600 of FIGS. 4-6, however the semiconductor package 700 also includes one or more die-side capacitors (DSC) 756 disposed on a top surface 701a of a substrate 701.

According to some embodiments, the semiconductor package 700 may illustrate some of the advantages of using multiple, separate smaller posts (e.g., compared to a lid with continuous legs around the entire periphery of the lid, or a discrete picture frame stiffener assembled to the substrate via an adhesive layer), such as an increase in the available surface area on the substrate that allows the incorporation of other components whose thickness is less than the substrate to lid vertical separation. This is shown in FIGS. 7A-7C with the semiconductor package 700, including a single die package in which one or more DSCs 756 are disposed under the lid shadow in the space between the posts. Note that this is also applicable to MCPs according to similar embodiments.

Referring now to FIG. 7A, the semiconductor package 700 has the posts 710 disposed on the top surface 701a of the substrate 701. For one embodiment, each of the posts 710 has a top surface 710a and a bottom surface 710b. The lid 702 may be disposed above the posts 710 on the substrate 701, where the lid 702 has a top surface 702a and a bottom surface 702b. Additionally, an adhesive layer 720 may be disposed on the top surface 710a of the posts 710, where the adhesive layer 720 is formed between the bottom surface 702b of the lid 702 and the top surfaces 710a of the posts 710.

For one embodiment, the posts 710 may be formed as one or more rectangles (or squares) on the outer edges (or corners) of the substrate 701. For example, the lid 702 may be a flat lid that is coupled to the posts 710 on the substrate 701 with the adhesive layer 720.

Referring now to FIG. 7B, the cross-sectional view of the semiconductor package 700 is shown along the B-B' axis (parallel to the A-A' axis shown in FIG. 7A). For some embodiments, the semiconductor package also has one or more DSCs 756 disposed on the top surface 701a of the substrate 701, where the DSCs 756 may be located in between the posts (not shown in FIG. 7B) and under the shadow of the lid 702 taking advantage of the increased available surface area on the substrate 701. Note that the semiconductor package 700 may include other components aside or in addition to the DSCs 756.

According to some embodiments, the semiconductor package 700 further includes the die 705 disposed on the top surface 701a of the substrate 701. As shown in FIG. 7B (and FIG. 7C), the die 705 is surrounded with the DSCs 756 (and the posts 710 as shown in FIG. 7C) and located roughly on a central region of the substrate 701. The lid 702 may be disposed above the DSCs 756 and the die 705 on the substrate 700. For some embodiments, the TIM 730 may be formed on the die 705, coupling the die 705 to the bottom surface 702b of the lid 702 thermally and/or mechanically.

Referring now to FIG. 7C, a top view of the semiconductor package 700 is shown without a lid (e.g., lid 702 of FIGS. 7A-7B), an adhesive layer (e.g., adhesive layer 720 of FIG. 7A), and a TIM layer (e.g., TIM 730 of FIG. 7B). As shown in FIG. 7C, the die 705 has a large surface area and is disposed on the top surface 701a of the substrate 701. For one embodiment, the die 705 is surrounded by posts 710 and DSCs 756 that are disposed on the substrate 701. For another embodiment, the DSCs 756 are disposed between the posts 710 on two edges of the substrate 701 (as shown in FIG. 7C) and thus one or more other components may be disposed on the other two edges of the substrate 701.

Note that the semiconductor package 700, as shown in FIGS. 7A-7C, may include fewer or additional packaging components based on the desired packaging design.

Figure 8:
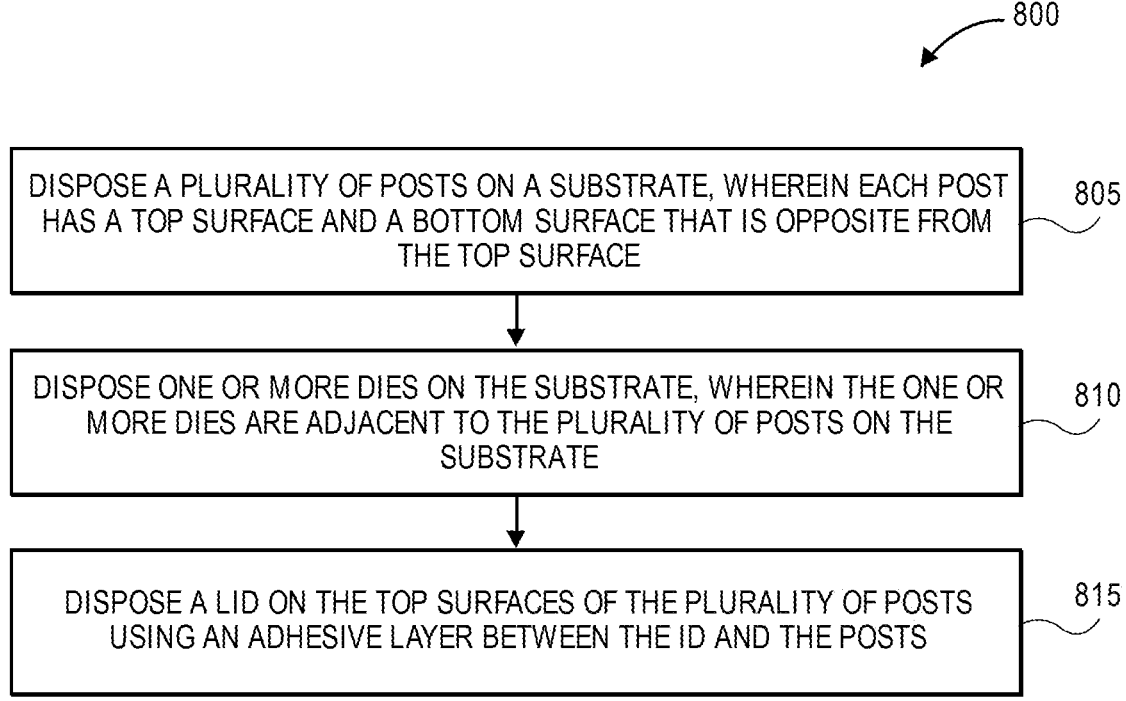
FIG. 8 is a process flow illustrating a method of forming a semiconductor package having a lid, one or more dies, one or more posts, and a substrate, according to one embodiment.

FIG. 8 is a process flow 800 illustrating a method of forming a semiconductor package having a lid, one or more dies, one or more posts, and a substrate, according to one embodiment. Process flow 800 illustrates a method of forming the semiconductor package. For example, process flow 800 shows a method of forming a semiconductor package as shown in FIGS. 1-7, using for example AM processes such as cold spray.

At block 805, the process flow 800 disposes a plurality of posts on a substrate, where each post has a top surface and a bottom surface that is opposite from the top surface (as shown in FIG. 1A). At block 810, the process flow 800 disposes one or more dies on the substrate, where the one or more dies are adjacent to (or surrounded by) the plurality of posts on the substrate (as shown in FIGS. 1A-1B). At block 815, the process flow 800 then disposes a lid on the top surface of the plurality of posts using an adhesive layer between the lid and the posts (as shown in FIG. 1A). For some embodiments, the process flow may also dispose a TIM layer above a top surface of each die (as shown in FIG. 1A) between steps 810 and 815. For other embodiments, the process flow may also dispose one or more other components (e.g., DSCs) on the substrate (as shown in FIG. 7B).

Note that the semiconductor package formed by process flow 800 may include fewer or additional packaging components based on the desired packaging design (e.g., as shown in FIGS. 1-7).

FIGS. 9-14 illustrate embodiments with integrated heat spreader customization using high throughput additive manufacturing for enhanced package thermomechanics. According to these embodiments, a semiconductor package may implement high throughput additive manufacturing to create custom features on a main, universal lid (e.g., lid 102 of FIG. 1A, lid 202 of FIG. 2A, etc.). Accordingly, a universal lid may be designed and manufactured in large volumes using standard processes (e.g., stamping) thus keeping the manufacturing cost low. Customizing the universal design for different packages and products can then be carried out during a final, high throughput additive manufacturing step that can be run as part of the assembly process. This step allows the simultaneous deposition and patterning of different features (e.g., one or more protrusions and/or legs as shown in FIGS. 9-13), which can provide the thermomechanical characteristics needed to prevent (or hinder) thermal and reliability issues, while allowing the universal lid to be shared across multiple packages and technologies. Note that these embodiments, as described herein, also allow greater flexibility in terms of material choices and patterns (as described in detail above).

Figure 9:
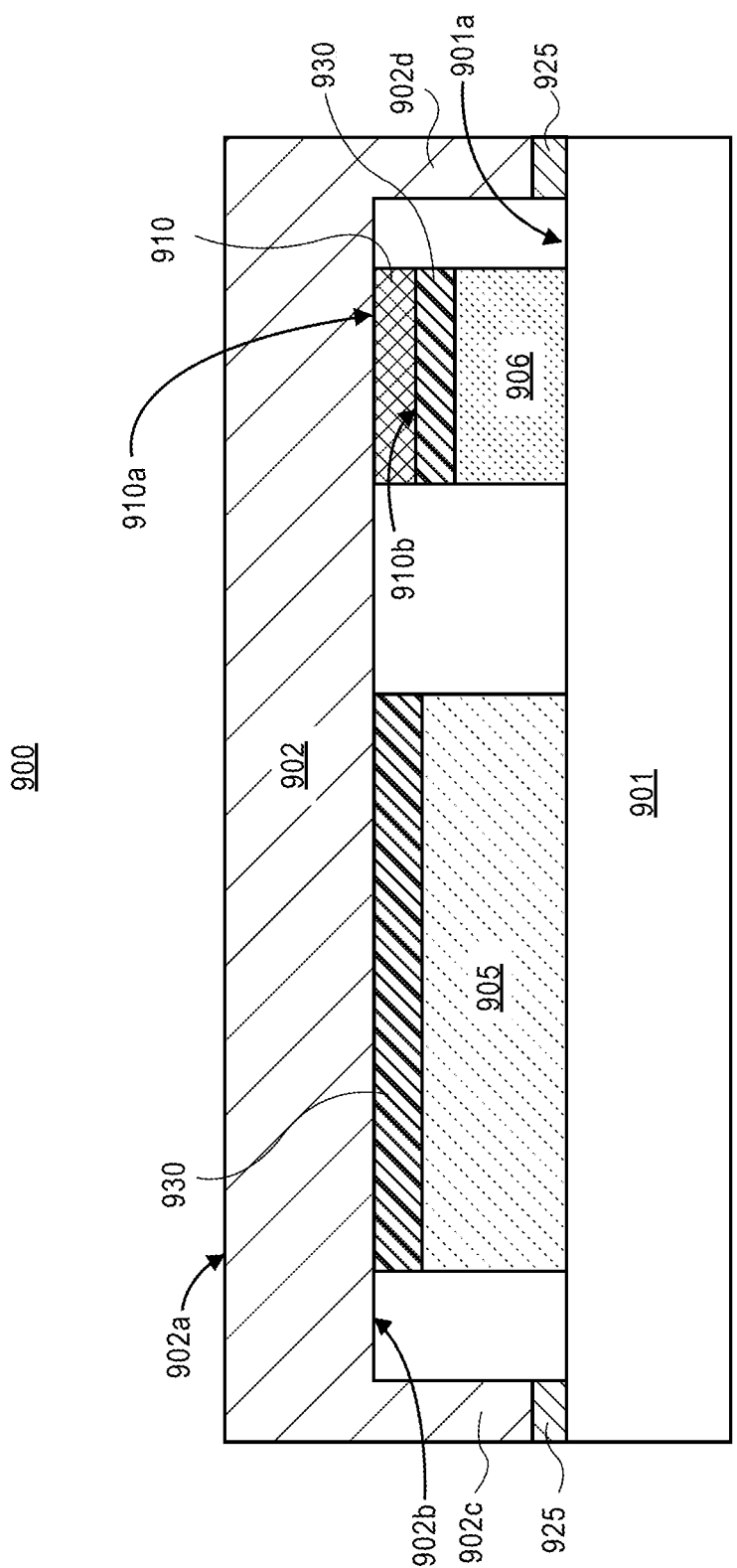
FIG. 9 is a cross-sectional view of a semiconductor package having a lid, one or more dies, a high throughput additively manufactured (HTAM) layer, and a substrate, according to one embodiment.

FIG. 9 is a cross-sectional view of a semiconductor package 900 having a lid 902, one or more dies 905-906, a high throughput additively manufactured (HTAM) layer 910, and a substrate 901, according to one embodiment. Note that the semiconductor package 900 of FIG. 9 is similar to the semiconductor packages 100 of FIG. 1A and 200 of FIG. 2A, however the semiconductor package 900 has the HTAM layer 910 disposed on a bottom surface 902b of the lid 902.

As used herein, a "HTAM layer" refers to an additively manufactured layer directly disposed on a lid using a high throughput deposition process and without the use of any intermediate adhesive layer. For example, the HTAM layer(s) may be patterned (as described in further detail below) to form custom features (e.g., protrusions and/or legs of varying sizes and shapes) on the lid to drastically reduce (or prevent) thermal, mechanical, and reliability issues, usually associated with MCPs. The HTAM layer may include one or more different materials, such as metals, metal alloys, metal/ceramic composites, polymers, polymer-metal composites (e.g., metal-filled resins), polymer-ceramic composites, epoxies, and/or any combination thereof. The HTAM layer's material properties (e.g., thermal conductivity, Young's modulus, coefficient of thermal expansion, or other properties) may be chosen or engineered to optimize the thermal and/or mechanical performance of the package.

As used herein, a "HTAM leg" refers to a portion of the HTAM layer that is disposed on one or more regions of the lid that do not fall within the die shadow (after the lid is assembled to the substrate containing the die or dies). For example, legs of varying sizes and shapes may be formed on the lid using a high throughout additive manufacturing process and are later mechanically coupled to regions on the substrate that do not contain die. The HTAM legs may also be implemented to address package thermomechanical issues.

The HTAM layers and legs can be formed through multiple methods, such as thermal spray, cold spray, dispensing, printing, etc. For example, when using cold spray to form the HTAM legs and layers, powders of the material to be deposited are accelerated through a nozzle at high speeds, forming a mechanical bond upon impact with the lid—without any adhesive layer. Patterning can be achieved by controlling the nozzle dimensions and movement, and/or by spraying the powders through a shadow mask containing the desired features. This approach allows flexibility in material choice since multiple material powders can be combined and used to create features with the desired thermal and mechanical properties. For some embodiments, this approach also allows the formation of the layers, legs, protrusions, etc., to be characterized as having a high throughput, realizing, for example, deposition rates around 50-100 um/sec in the thickness direction (depending on desired feature size and shape).

Referring now to FIG. 9, the semiconductor package 900 includes the HTAM layer 910 disposed on a bottom surface 902b of the lid 902, where the lid 902 has a top surface 902a and a bottom surface 902b. The lid 902 may be a flat lid with legs 902c-d on the outer periphery (or edges) of the lid 902. For one embodiment, the HTAM layer 910 has a top surface 910a and a bottom surface 910b. The semiconductor package 900 further includes dies 905-906 disposed on the top surface 901a of the substrate 901, where the die 905 has a larger z-height than the die 906. The lid 902 and the HTAM layer 910 disposed on the bottom surface 902b of the lid 902 may then be disposed above the dies 905-906 on the substrate 901, attaching the legs 902c-d of the lid 902 to the substrate 901 with a sealant 925.

The present embodiments, as illustrated in FIG. 9, address the issue of varying die heights in a MCP by depositing (or disposing) the HTAM layer 910 on the bottom surface 902b of the lid 902 within the die shadow of die 906. This way, the TIM 930 above die 906 can be kept thin as the z-height mismatch between dies 905 and 906 is accommodated by the HTAM layer 910 (which can be deposited using metals or certain ceramics, achieving a thermal conductivity that can be 1-2 orders of magnitude higher than that of the TIM 930). This HTAM layer 910, therefore, maintains a reduced thermal resistance between the die 906 and the lid 902.

For one embodiment, the HTAM layer 910 may be formed as a large rectangle to match the die shadow of die 906. For other embodiments, the HTAM layer 910 is patterned with one or more different shapes and sizes (e.g., oval, square, picture frame, etc.) based on the desired package design. In addition, the lid 902 may be mechanically (and/or thermally) coupled to the substrate 901 with the sealant 925. The sealant 925 is formed between the top surface 901a of the substrate 901 and the bottom surfaces of the legs 902c-d.

For some embodiments, the TIMs 930 may be formed on the dies 905-906, coupling die 905 to the bottom surface 902b of the lid 902 and die 906 to the HTAM layer 910. For one embodiment, the BLT of the TIM 930 on die 905 may be equal or substantially equal to the BLT of TIM 930 on die 906, where the HTAM layer 920 accommodates for the varying z-heights of the dies 905-906. For another embodiment, the BLT of the TIM 930 on die 905 may be different from the BLT of TIM 930 on die 906.

Note that the semiconductor package 900 may include fewer or additional packaging components based on the desired packaging design.

Figure 10:
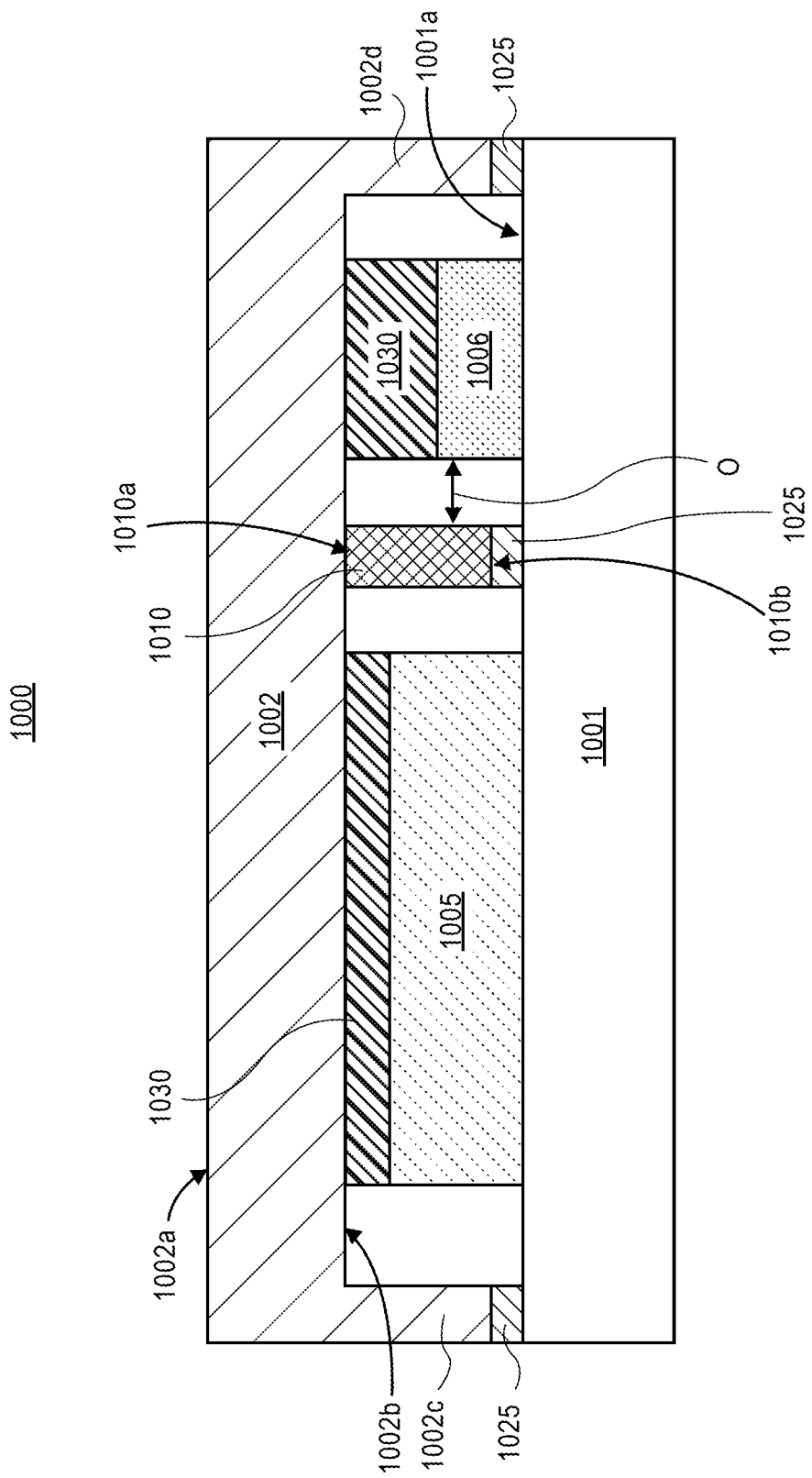
FIG. 10 is a cross-sectional view of a semiconductor package having a lid, one or more dies, a HTAM leg, and a substrate, according to one embodiment.

FIG. 10 is a cross-sectional view of a semiconductor package 1000 having a lid 1002, one or more dies 1005-1006, a HTAM leg 1010, and a substrate 1001, according to one embodiment. Note that the semiconductor package 1000 of FIG. 10 is similar to the semiconductor packages of FIGS. 1-7 and 9, however the semiconductor package 1000 has the HTAM leg 1010 disposed on a bottom surface 1002b of the lid 1002.

Referring now to FIG. 10, the semiconductor package 1000 includes the HTAM leg 1010 disposed on the bottom surface 1002b of the lid 1002, where the lid 1002 has a top surface 1002a and a bottom surface 1002b. The lid 1002 may be a flat lid with legs 1002c-d on the outer periphery of the lid 1002. For one embodiment, the HTAM leg 1010 has a top surface 1010a and a bottom surface 1010b. The semiconductor package 1000 further has dies 1005-1006 disposed on the top surface 1001a of the substrate 1001, where the die 1005 has a larger z-height than the die 1006. For one embodiment, the dies 1005-1006 may be separated by the HTAM leg 1010 to reduce the maximum overhang between the edge of each die and the closest lid leg on the corresponding die side (for example, overhang "O" for the left side of die 1006 is shown in the figure). In addition, the lid 1002 and the HTAM leg 1010 disposed on the bottom surface 1002b of the lid 1002 may then be disposed above the dies 1005-1006 on the substrate 1001, attaching the legs 1002c-d of the lid 1002 and the bottom surface 1010b of the HTAM leg 1010 to the substrate 1001 with a sealant 1025.

Figure 11:
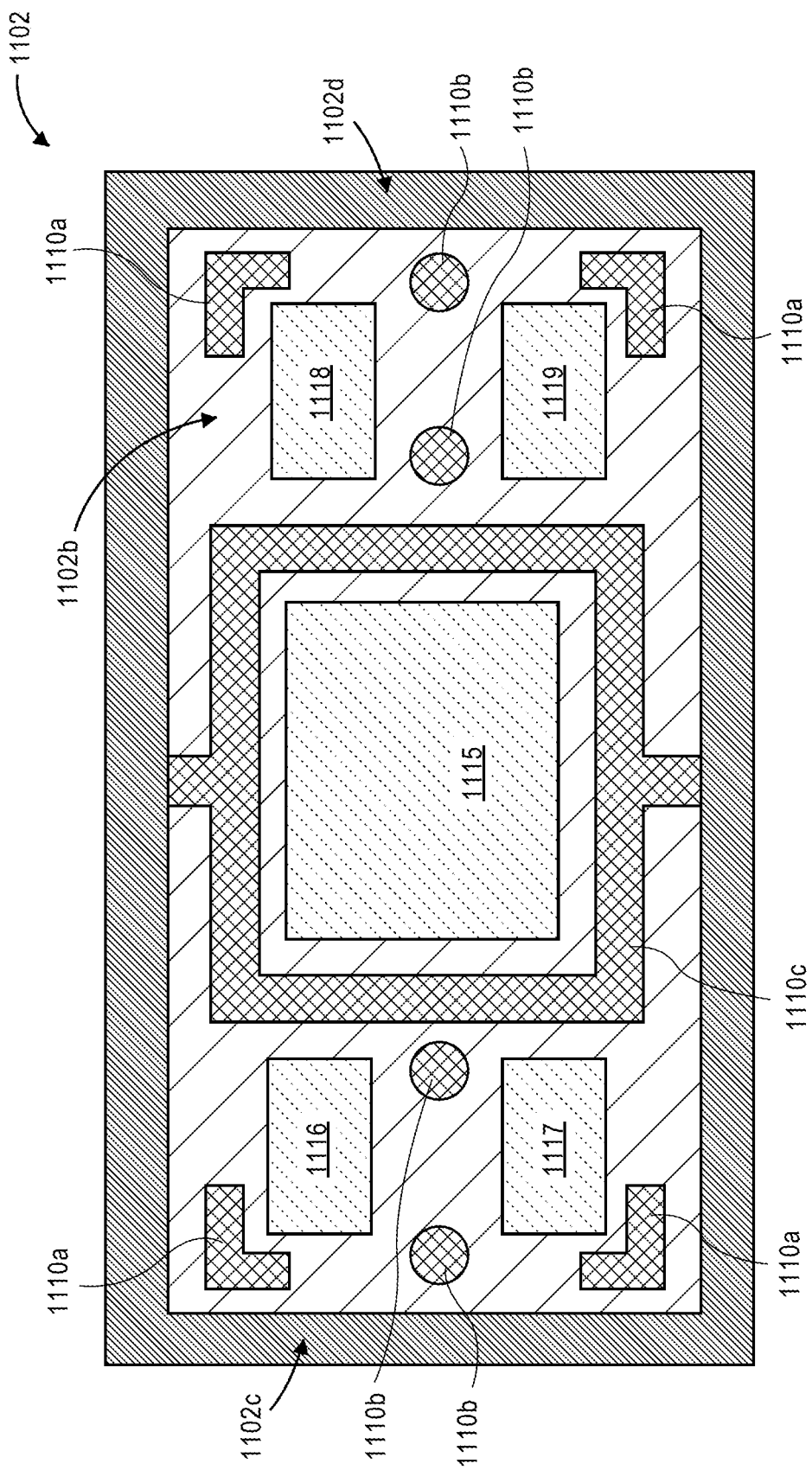
FIG. 11 is a plan view of a bottom surface of a lid with one or more HTAM legs showing their locations with respect to one or more die shadows, according to one embodiment.

The present embodiment, as illustrated in FIG. 10, addresses the issue of TIM stresses and delamination at the die edges due to large die overhang in the absence of the HTAM leg 1010. However, once the HTAM leg 1010 (or post) is formed on the bottom surface 1002b of the lid, the overhang ("O") can be greatly reduced for different package configurations (e.g., semiconductor package 1000) by using the same lid (e.g., lid 1002), and varying the locations of the additively manufactured legs (e.g., HTAM leg 1010) depending on the locations of the dies in each package configuration. For one embodiment, the HTAM leg 1010 has a straight rectangular shape. For other embodiments, the HTAM leg 1010 may also include other different shapes and sizes, such as an L-shape, T-shape, H-shape, picture frame, round pillars, etc., and/or any combination therein (e.g., as shown in FIG. 11).

For some embodiments, the lid 1002 may be mechanically (and/or thermally) coupled to the substrate 1001 with the sealant 1025. The sealant 1025 may be formed between the top surface 1001a of the substrate 1001 and the bottom surfaces of the legs 1002c-d and the HTAM leg 1010.

For some embodiments, the TIMs 1030 may be formed on the dies 1005-1006, coupling the dies 1005-1006 to the bottom surface 1002b of the lid 1002. For one embodiment, the BLT of the TIM 1030 on die 1005 may be equal or substantially equal to the BLT of TIM 1030 on die 1006, where for example a HTAM layer (not shown) may be formed to accommodate for the varying z-heights of the dies 1005-1006. For another embodiment, the BLT of the TIM 1030 on die 1005 may be different from the BLT of the TIM 1030 on die 1006, as shown in FIG. 10.

Note that the semiconductor package 1000 may include fewer or additional packaging components based on the desired packaging design.

FIG. 11 is a plan view of a bottom surface 1102b of a lid 1102 with one or more HTAM legs 1110a-c, and showing one or more die shadows 1115-1119 according to one embodiment. Note that the lid of FIG. 11 is similar to the lids used with the semiconductor packages as illustrated in FIGS. 1-7 and 9-10.

Referring now to FIG. 11, the lid 1102 has one or more HTAM legs 1110a-c disposed on the bottom surface 1102b of the lid 1102. For some embodiments, the HTAM legs 1110a-c may have one or more different shapes that may be used for different packages to optimize each package's thermomechanical performance (e.g., reducing a package's TIM stresses and preventing delamination). For example, the HTAM legs 1110a-c may include four L-shaped corner HTAM legs 1110a, four round pillar HTAM legs 1110b, and a picture frame HTAM leg 1110c. For some embodiments, the HTAM legs 1110a-c may be adjacent to or may surround one or more of the die shadow regions 1115-1119. Note that a die shadow refers to a region on the bottom surface of a lid that occupies the same xy location as one of the dies on the substrate, once the lid is assembled to the substrate.

For some embodiments, the HTAM legs 1110a-c may be formed using AM methods, such as cold spray. For example, the patterning of the HTAM legs 1110a-c can be achieved by controlling the nozzle dimensions and movement, and/or by spraying the one or more powder materials through a shadow mask (not shown) to form the respective shapes (or any other desired shapes) directly on the bottom surface 1102b of the lid 1102.

Note that the lid 1102 may include fewer or additional packaging components based on the desired packaging design.

Figure 12:
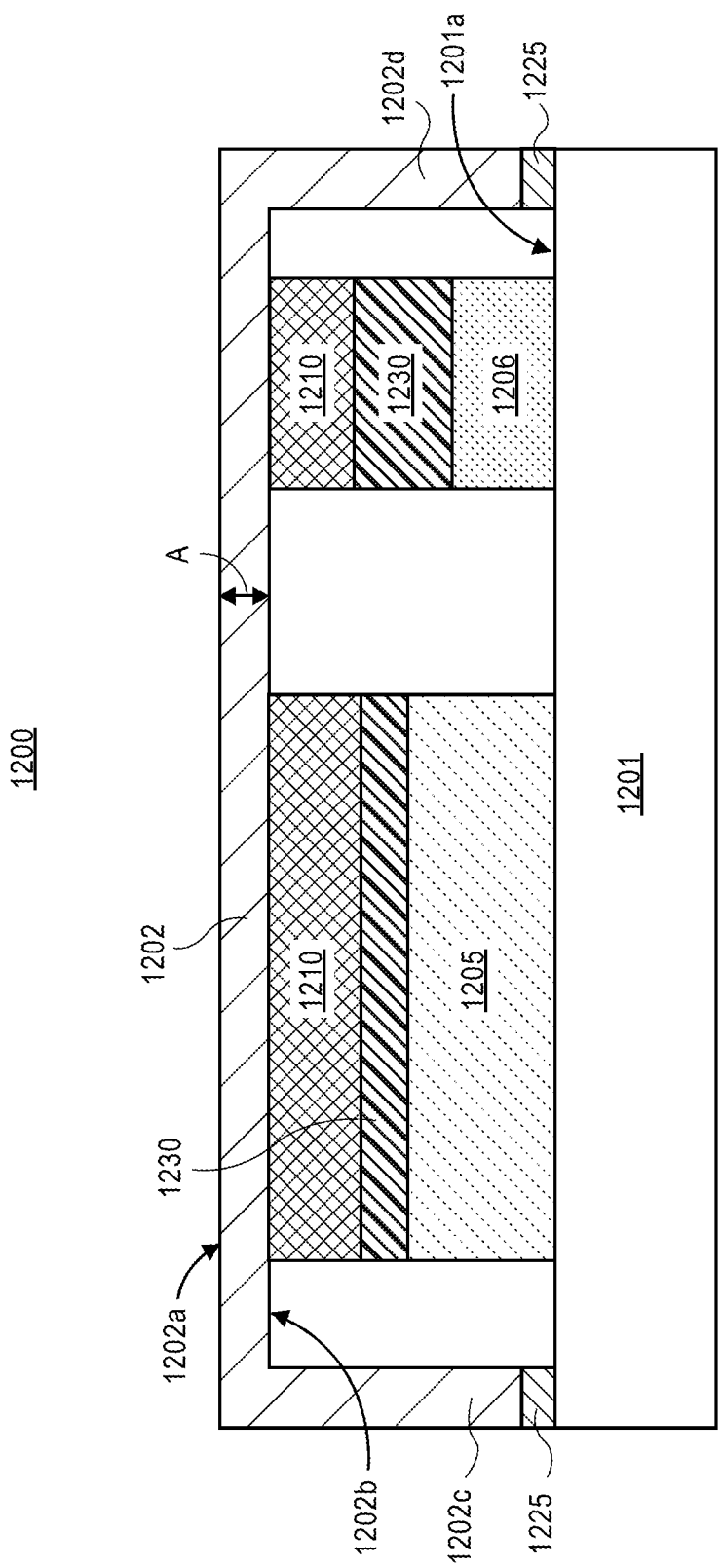
FIG. 12 is a cross-sectional view of a semiconductor package having a lid, one or more dies, one or more HTAM layers, and a substrate, according to one embodiment.

FIG. 12 is a cross-sectional view of a semiconductor package 1200 having a lid 1202, one or more dies 1205-1206, one or more HTAM layers 1210, and a substrate 1201, according to one embodiment. Note that the semiconductor package 1200 of FIG. 12 is similar to the semiconductor packages of FIGS. 1-7 and 9-10, however the semiconductor package 1200 has HTAM layers 1210 disposed on bottom surfaces 1202b of the lid 1202 and above each of the dies 1205-1206. Also note that having these HTAM layers 1210 on a lid 1202 with a thin top (shown as having thickness "A") helps to maintain the heat spreading from each die 1205-1206 through the lid while reducing the thermal cross-talk between the dies 1205-1206.

Referring now to FIG. 12, the semiconductor package 1200 includes the HTAM layers 1210 disposed directly on the bottom surfaces 1202b (i.e., the die shadow regions) of the lid 1202. The lid 1202 may be a flat lid with the thin top (having thickness "A") and legs 1202c-d on the outer periphery of the lid 1202. The semiconductor package 1200 further includes dies 1205-1206 disposed on the top surface 1201a of the substrate 1201, where the die 1205 has a larger z-height than the die 1206. The lid 1202 and the HTAM layers 1210 disposed on the lid 1202 may then be disposed above the dies 1205-1206 on the substrate 1201, attaching the legs 1202c-d of the lid 1202 to the substrate 1201 with a sealant 1225.

The present embodiments, as illustrated in FIG. 12, address the issue of thermal cross-talk between dies 1205-1206 by implementing a lid 1202 with a very thin top (having thickness "A" as shown) and by depositing the HTAM layers 1210 only in the die shadow locations on the lid (with respect to dies 1205-1206). This way, heat spreading from each die 1205-1206 through the lid is maintained, for example, by using one or more high-thermal conductivity materials for the HTAM layers 1210. In addition, the thermal cross-talk between the two dies 1205-1206, which is proportional to the cross-sectional area or thickness "A" of the lid, is reduced.

For one embodiment, the HTAM layers 1210 may be formed as large rectangles to match the die shadows of dies 1205-1206. For other embodiments, the HTAM layers 1210 may be patterned with one or more different shapes and sizes based on the desired package design. In addition, the lid 1202 may be mechanically (and/or thermally) coupled to the substrate 1201 with the sealant 1225. The sealant 1225 is formed between the top surface 1201a of the substrate 1201 and the bottom surfaces of the legs 1202c-d.

For some embodiments, the TIMs 1230 may be formed on the dies 1205-1206, coupling dies 1205-1206 to the HTAM layers 1210 on the lid 1202. For one embodiment, the BLT of the TIM 1230 on die 1205 may be different from the BLT of the TIM 1230 on die 1206 based on the varying z-heights of dies 1205-1206 and the thicknesses of HTAM layers 1210. For other embodiments, the BLT of the TIM 1230 on die 1205 may be similar or equal to the BLT of the TIM 1230 on die 1206, for example, by choosing different thicknesses of the HTAM layers 1210 to accommodate for the varying z-heights of the dies 1205-1206.

Note that the semiconductor package 1200 may include fewer or additional packaging components based on the desired packaging design.

Figure 13:
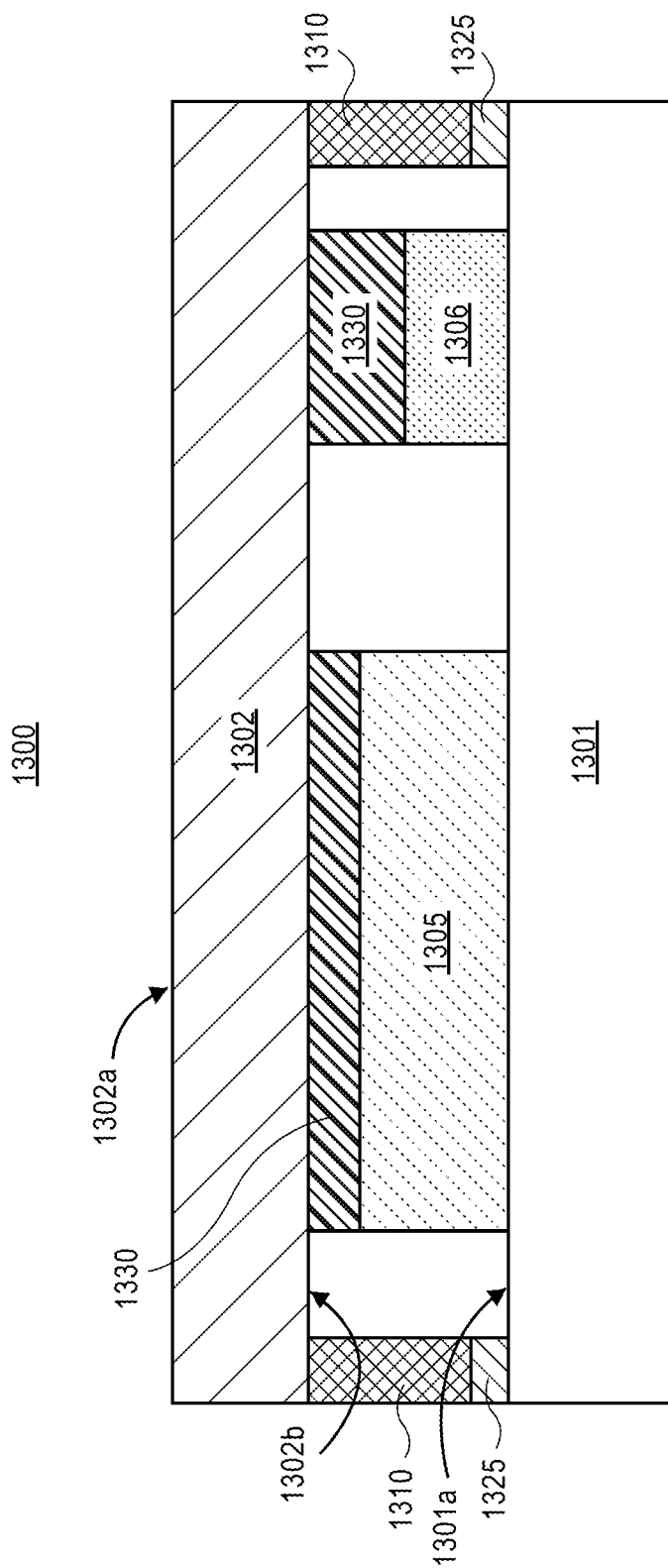
FIG. 13 is a cross-sectional view of a semiconductor package having a lid, one or more dies, one or more HTAM legs, and a substrate, according to one embodiment.

FIG. 13 is a cross-sectional view of a semiconductor package 1300 having a lid 1302, one or more dies 1305-1306, one or more HTAM legs 1310, and a substrate 1301, according to one embodiment. Note that the semiconductor package 1300 of FIG. 13 is similar to the semiconductor packages of FIGS. 1-7, 9-10, and 12, however the semiconductor package 1300 has HTAM legs 1310 disposed directly on the edges of the lid 1302, thus replacing the built-in (e.g., stamped) lid legs (e.g., legs 1202c-d of FIG. 12) with the HTAM legs 1310. Also note that having these HTAM legs 1310 additively manufactured onto the periphery of a universal, flat lid 1302 helps to simplify the packaging process and further reduce the manufacturing cost.

Referring now to FIG. 13, the semiconductor package 1300 includes the HTAM legs 1310 disposed directly on the bottom surface 1302b of the lid 1302. The lid 1302 may be a flat lid top with no built-in (e.g., stamped) legs. Instead of having built-in legs, HTAM legs 1310 are disposed on the outer periphery of the lid 1302. The semiconductor package 1300 further includes dies 1305-1306 disposed on the top surface 1301a of the substrate 1301, where the die 1305 has a larger z-height than the die 1306. The lid 1302 with the HTAM legs 1310 may then be disposed above the dies 1305-1306 on the substrate 1301, attaching the HTAM legs 1310 disposed on the lid 1302 to the substrate 1301 with a sealant 1325.

For one embodiment, the HTAM legs 1310 may be formed as large rectangles. For other embodiments, the HTAM legs 1310 may be patterned with one or more different shapes and sizes based on the desired package design, such as HTAM legs formed as round pillars, a picture frame, etc. In addition, the lid 1302 may be mechanically (and/or thermally) coupled to the substrate 1301 with the sealant 1325. The sealant 1325 is formed between the top surface 1301a of the substrate 1301 and the bottom surfaces of the HTAM legs 1310.

For some embodiments, the BLT of the TIM 1330 on die 1305 may be different from the BLT of the TIM 1330 on die 1306 to accommodate for the varying z-heights of the dies 1305-1306. For other embodiments, a HTAM layer (similar to layer 1210 shown in FIG. 12) can be formed on the lid in one or more of the die shadow regions to accommodate for the varying z-heights of the dies. For some of those other embodiments (e.g. using a HTAM layer in the die shadow regions), the BLT of the TIM 1330 on die 1305 may be equal or substantially equal to the BLT of TIM 1330 on die 1306.

Note that the semiconductor package 1300 may include fewer or additional packaging components based on the desired packaging design. For example, these embodiments may include any combinations of the above embodiments to address one or more thermal issues, including forming a lid with inner HTAM legs (and/or posts) and a pedestal in the thin die shadow region to reduce both die overhang and thin die junction to lid thermal resistance, etc.

Figure 14:
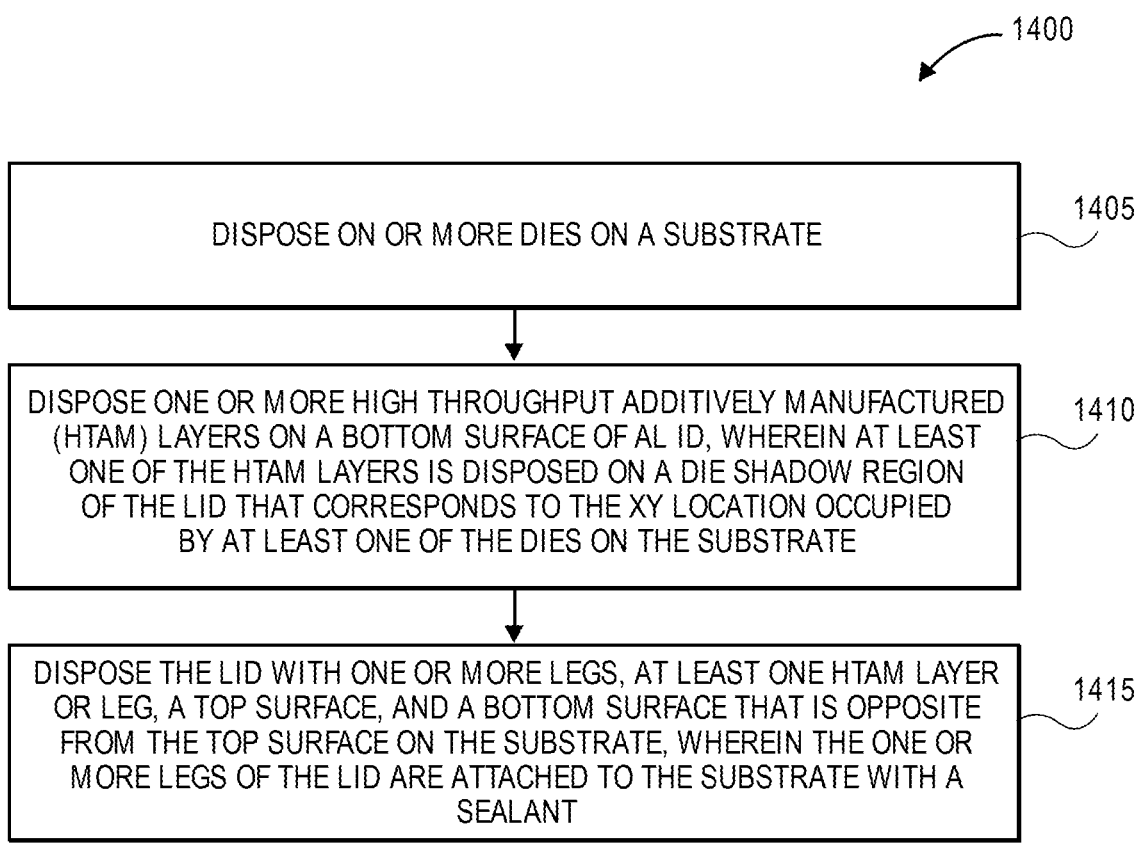
FIG. 14 is a process flow illustrating a method of forming a semiconductor package having a lid, one or more dies, one or more HTAM layers, and a substrate, according to one embodiment.

FIG. 14 is a process flow 1400 illustrating a method of forming a semiconductor package having a lid, one or more dies, one or more HTAM layers, and a substrate, according to one embodiment. Process flow 1400 illustrates a method of forming the semiconductor package. For example, process flow 1400 shows a method of forming a semiconductor package as shown in FIGS. 9-13, using for example AM processes such as cold spray.

At block 1405, the process flow 1400 disposes one or more dies on a substrate (as shown in FIG. 9). At block 1410, the process flow 1400 disposes one or more HTAM layers on a bottom surface of a lid, wherein at least one of the HTAM layers is disposed on a die shadow region of the lid that corresponds to the xy location occupied by (or that is coplanar to) at least one of the dies on the substrate (as shown in FIG. 9). For another embodiment, the process flow may dispose the HTAM layers on die shadow regions of the lid that correspond to each of the one or more dies on the substrate (as shown in FIG. 12, i.e., one HTAM layer for each die shadow region). For another embodiment, the process flow may dispose HTAM legs as part of the HTAM layer on a bottom surface of the lid in regions that are not within the die shadows. At block 1415, the process flow 1400 then disposes the lid with one or more legs, at least one HTAM layer or leg, a top surface, and a bottom surface that is opposite from the top surface on the substrate, wherein the one or more legs of the lid are attached to the substrate with a sealant (as shown in FIG. 9). For some embodiments, the process flow may also dispose one or more TIM layers above a top surface of each of the one or more dies (as shown in FIGS. 9, 10, and 12-13).

Note that the semiconductor package formed by process flow 1400 may include fewer or additional packaging components based on the desired packaging design.

FIGS. 15-19 illustrate embodiments of semiconductor packages using a highly-conductive (HC), intermediate layer deposited on a die by implementing a high-throughput additive deposition prior to dispensing a TIM layer. As used herein, a "HC intermediate layer" refers to a layer having a high thermal conductivity and formed with an AM method. FIGS. 15-19 illustrate embodiments that use STIM and other novel or non-standard TIMs to improve the overall performance of the package as compared to using a typical PTIM, while also eliminating the need for traditional wafer-level BSM to enable wettability or special surface functionalization to improve adhesion.

These embodiments (e.g., as described in FIGS. 15-19) enhance packaging solutions by using a direct-write, high throughput additive deposition method that forms a highly conductive (HC) layer (also referred to as an intermediate layer, an additive deposition (AD) layer, or a HC intermediate layer) on a backside of a die at the wafer, die, or package level. This method, as described herein, is compatible with STIM and other novel or non-standard TIMs. For example, these embodiments enable the use of cold spray technology allowing the fast deposition of metals, metal alloys, and/or metal ceramic mixtures (or a combination thereof) directly on any semiconductor die (or components) at the wafer, die, or package level—without the need for BSM, surface functionalization, or adhesion layers. In addition, these embodiments facilitate the formation of one or more HC layers at high deposition rates (e.g., layers that are few 100s of um thick can be deposited in roughly a few seconds). For some embodiments, the intermediate layers, as described herein, may be formed with 25-300 um thick layers that include one or more different metals and ceramics (e.g., copper (Cu), nickel (Ni), aluminum (Al), aluminum oxide (Al2O3)) directly disposed on a die (or any other packaging component) without any adhesion layers in between.

According to some embodiments, the additive deposition used to form a HC intermediate layer (e.g., the HC intermediate layer 1510 of FIG. 15) has several significant advantages and unique capabilities compared to other typically used packaging solution/approaches (e.g., plating or wafer-level sputtering to create BSM, etc.). In particular, several of the advantages of the present embodiments (e.g., as shown in FIGS. 15-19) include: (i) a semiconductor package enabling the use of different TIMs such as solder TIM, high-metal filler epoxy TIMs, or sinterable pastes, all having good adhesion to the dies; (ii) no requirement of wafer-level BSM; (iii) the intermediate layer (between die and TIM1) can be made from pure metals, metal alloys, and/or metal/ceramic composites, and its properties can be tailored for optimizing package thermals and mechanics (note that this flexibility in material selection is not available with other deposition methods such as electroplating which are limited to metals); (iv) a decreased deposition time compared to plating, sputtering, etc. (e.g., a 50 or 100 um metal layer can be produced in seconds or less using cold spray, but may take hours to plate); (v) the intermediate layer can be deposited at a wafer, die, or package level, and can thus be applied to any wafers as well as to any singulated dies or packages (e.g., memory stacks); (vi) the intermediate layer can be deposited while keeping the die, package, or wafer at room temperature; (vii) the deposition conditions can be tailored to produce the intermediate layer with a rough surface, which can help improve adhesion to the TIM layer (e.g., metal-filled epoxy TIM or sintered paste) and increase surface area for heat transfer; and (viii) when patterned features (instead of a blanket coating) of the intermediate layer are desired, these embodiments can be easily implemented as part of the deposition method, given the nature of the AM processes being used, thus eliminating the need for multiple, expensive lithography steps (e.g., resist deposition, exposure, development, resist removal, etc.) used in conjunction with other deposition approaches, such as plating.

Figure 15:
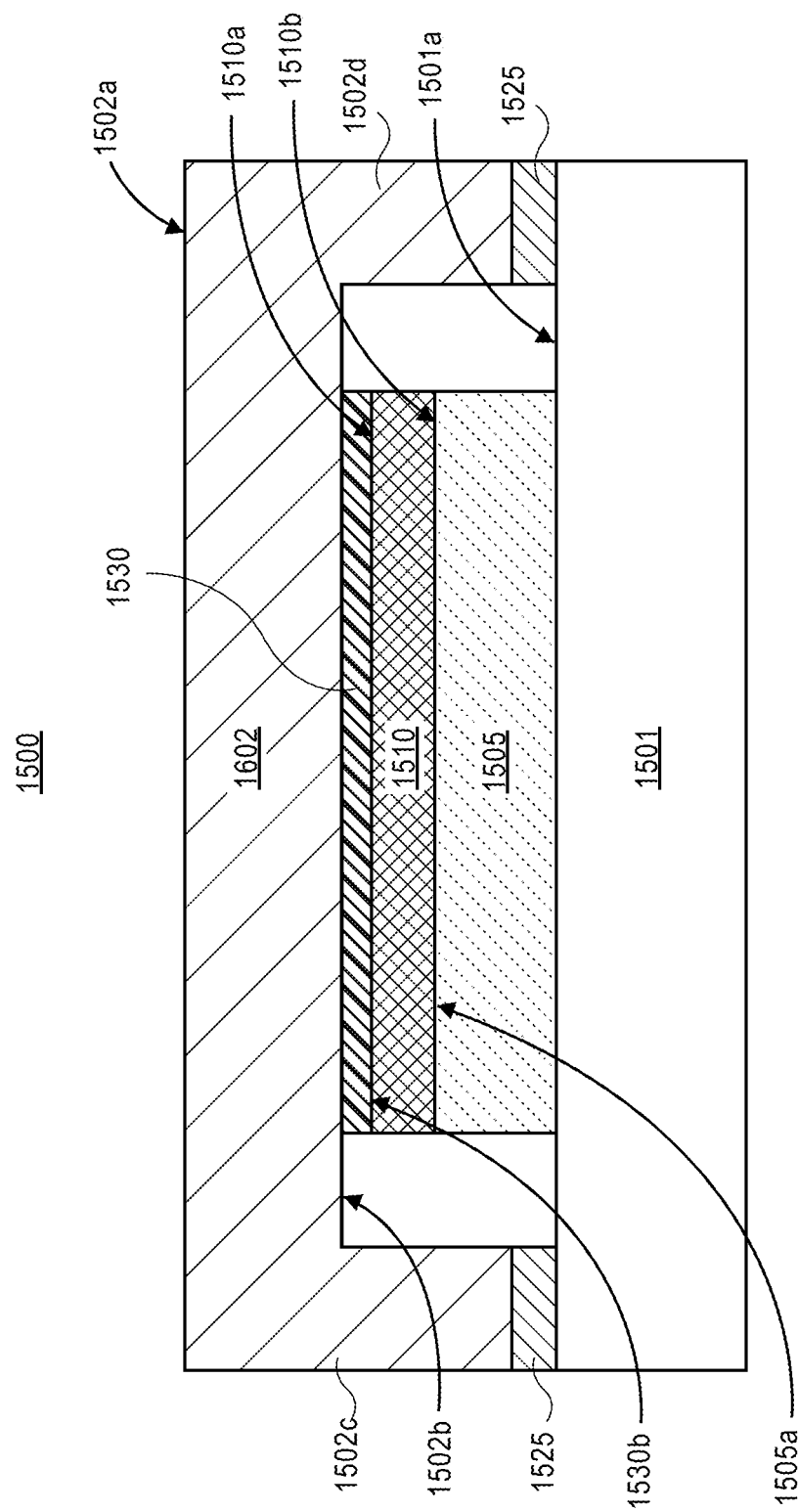
FIG. 15 is a cross-sectional view of a semiconductor package having a lid, a die, a highly conductive (HC) intermediate layer, a TIM layer, and a substrate, according to one embodiment.

FIG. 15 is a cross-sectional view of a semiconductor package 1500 having a lid 1502, a die 1505, a HC intermediate layer 1510, a TIM layer 1530, and a substrate 1501, according to one embodiment. Note that the semiconductor package 1500 of FIG. 15 is similar to the semiconductor packages of FIGS. 1-7 and 9-13, however the semiconductor package 1500 has the HC intermediate layer 1510 disposed between the TIM 1530 and the die 1505.

Referring now to FIG. 15, the semiconductor package 1500 includes the HC intermediate layer 1510 disposed on a top surface 1505a of the die 1505. For one embodiment, the HC intermediate layer 1510 is disposed/formed between the top surface 1505a of the die 1505 and a bottom surface 1530b of TIM 1530. The semiconductor package 1500 further includes a lid 1502 (or an IHS) having a top surface 1502a and a bottom surface 1502b. For some embodiments, the lid 1502 may be a flat lid with legs 1502c-d on the outer periphery of the lid 1502. For one embodiment, the HC intermediate layer 1510 has a top surface 1510a and a bottom surface 1510b. For example, the top surface 1510a of the HC intermediate layer 1510 is directly attached to the bottom surface 1530b of the TIM 1530, while the bottom surface 1510b of the HC intermediate layer 1510 is directly attached to top surface 1505a of the die 1505 (note that no adhesion layer is formed in between these surfaces). The semiconductor package 1500 also has dies 1505 disposed on the top surface 1501a of the substrate 1501. The bottom surface 1502b of the lid 1502 may be disposed above the TIM 1530, the HC intermediate layer 1510, and the die 1505, respectively, on the substrate 1501, where the legs 1502c-d of the lid 1502 are attached to the substrate 1501 with a sealant 1525.

The present embodiments, as illustrated in FIG. 15, show the HC intermediate layer 1510 that is additively deposited (AD) between the die 1505 and TIM 1530, for example, to widen the range of materials that can be used for TIM 1530. For example, the TIM 1530 may be formed using one or more different materials, such as polymer TIMs (which have good adhesion to dies but suffer from a relatively low effective thermal conductivity (2-5 W/m-K) compared to other TIMs), other TIMs (e.g., high metal filler epoxy, sintered paste, or solder TIM which may have higher thermal conductivities than polymer TIM but may not adhere as well to dies or may not wet the die surface altogether), and any other combination therein. This approach allows the HC intermediate layer 1510 to be formed using multiple different materials with an AM process and helps improve TIM adhesion as well as thermal and/or other thermomechanical properties of the overall package 1500.

For some embodiments, the semiconductor package 1500 implements high throughput AD method(s) to deposit/dispose the HC intermediate layer 1510 between the die 1505 and TIM 1530, enabling the use of a wide range of TIM materials including novel or non-standard TIMs. The HC intermediate layer 1510 can be made of metal, metal alloys, and/or metal/ceramic mixtures. The HC intermediate layer 1510 can also be used to enhance adhesion of the TIM 1530 (e.g., epoxy TIM with metal filler) to the die 1505 or used to allow wettability of the backside of the die 1505 by the TIM 1530 (e.g., STIM). In addition, HC intermediate layer 1510 can also include one or more sublayers of multiple different materials deposited on top of each other (e.g., a first layer is a metal, a second layer is a PTIM and stacked on the first layer, etc.).

For example, a HC intermediate layer (e.g., HC intermediate layer 1510) may be formed with a cold spray additive deposition of 25-300 um thick metal or metal/ceramic layers directly on a die without any adhesion layer. In this example, the solid powders of the desired material or material mixtures (e.g., metal and metal/ceramic particles) are deposited and then accelerated in a carrier gas jet (e.g., compressed air) by passing the jet through a converging diverging nozzle. The jet exits the nozzle at a high velocity and is disposed on the die, where the impact causes the solid particles in the jet to plastically deform and bond to the die surface. Subsequent layers of the materials are similarly adhered to (or disposed on) each underlying layer upon continued jet impact, producing a fast buildup of layers (e.g., layers that are few 100s of microns thick can be deposited in seconds or less). Moreover, unlike thermal spraying techniques, the cold spray additive deposition does not require melting the particles, enabling the die and/or substrate to remain at room temperature during the deposition of the HC materials.

For one embodiment, the HC intermediate layer 1510 may be formed as a large rectangle to match the die shadow of die 1505. For other embodiments, the HC intermediate layer 1510 is patterned with one or more different shapes and sizes (e.g., oval, square, picture frame, etc.) based on the desired package design. As additive manufacturing is used, patterning to create one or more different shapes/features can be achieved as part of the deposition step by using a nozzle with a small exit diameter or a shadow mask for very small features. Note that this eliminates the need for using lithography and the additional steps associated with lithography, including subtractive or semi-additive methods, such as plating, sputtering, etc.

In addition, the lid 1502 may be mechanically (and/or thermally) coupled to the substrate 1501 with the sealant 1525. The sealant 1525 is formed between the top surface 1501a of the substrate 1501 and the bottom surfaces of the legs 1502c-d of the lid 1502.

For some embodiments, the TIM 1530 may be formed on the HC intermediate layer 1510, coupling the bottom surface 1502b of the lid 1502 and the top surface 1510a of the HC intermediate layer 1510.

Note that the semiconductor package 1500 may include fewer or additional packaging components based on the desired packaging design.

Figure 16A:
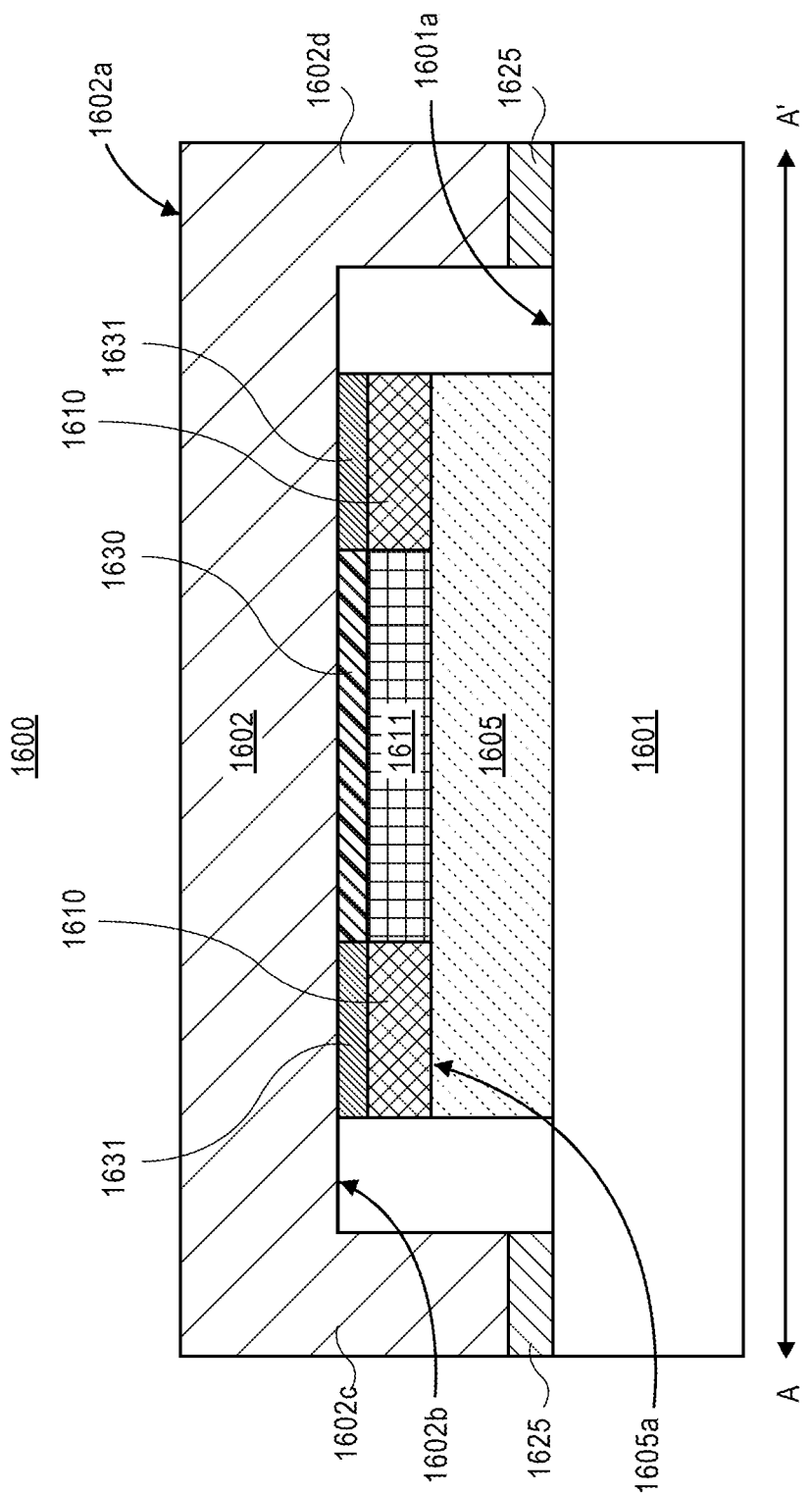
FIG. 16A is a cross-sectional view of a semiconductor package having a lid, a die, one or more HC intermediate layers, one or more TIM layers, and a substrate, according to one embodiment.
Figure 16B:
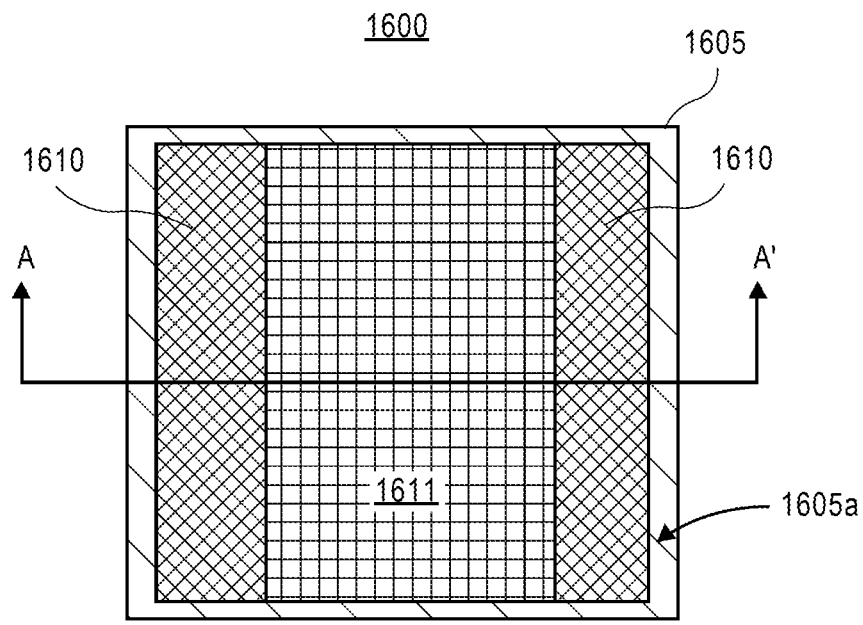
FIG. 16B is a corresponding plan view of the die and the HC intermediate layers, according to one embodiment.
Figure 16C:
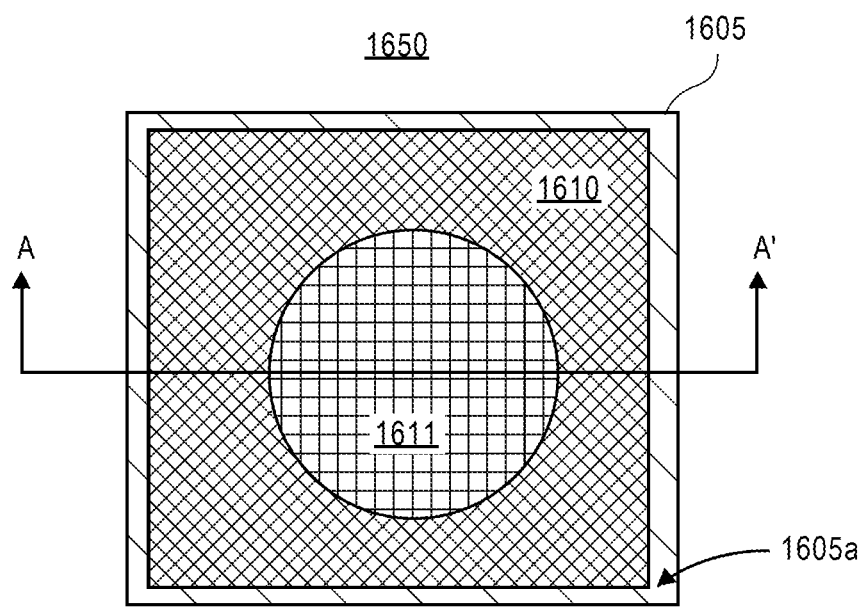
FIG. 16C is a corresponding plan view of the die and the HC intermediate layers, according to an alternative embodiment.

FIG. 16A is a cross-sectional view of a semiconductor package 1600 (with the die and HC intermediate layers shown in top plan view in FIG. 16B, and in a different configuration 1650 in FIG. 16C) along the A-A' axis.

Referring now to FIG. 16A, the semiconductor package 1600 has a lid 1602, a die 1605, one or more HC intermediate layers 1610-1611, one or more TIM layers 1630-1631, and a substrate 1601, according to one embodiment. Note that the semiconductor package 1600 of FIG. 16 is similar to the semiconductor packages of FIGS. 1-7, 9-13, and 15, however the semiconductor package 1600 has a first HC intermediate layer 1610 disposed between a first TIM 1631 (e.g., a first TIM material, such as epoxy TIM with metal filler) and the die 1605, and a second HC intermediate layer 1611 disposed between a second TIM 1630 (e.g., a second TIM material, such as solder TIM) and the die 1605.

For one embodiment, the first HC intermediate layer 1610 and the second HC intermediate layer 1611 are both disposed on a top surface of the die 1505. For one embodiment, the first HC intermediate layer 1610 is disposed between the die 1605 and the first TIM 1631, while the second HC intermediate layer 1611 is disposed between the die 1605 and the second TIM 1630. Note that the first HC intermediate layer 1610 surrounds the second HC intermediate layer 1611, and the first TIM 1631 accordingly surrounds the second TIM 1630.

The semiconductor package 1600 further includes a lid 1602 having a top surface 1602a and a bottom surface 1602b. For some embodiments, the lid 1602 may be a flat lid with legs 1602c-d on the outer periphery of the lid 1602. For one embodiment, each of the HC intermediate layers 1610-1611 has a top surface and a bottom surface. For example, the top surface of the first HC intermediate layer 1610 is directly attached to the bottom surface of the first TIM 1631, while the bottom surface of the first HC intermediate layer 1610 is directly attached to top surface 1605a of the die 1605 (note that no adhesion layer is formed in between these surfaces). Likewise, the top surface of the second HC intermediate layer 1611 is directly attached to the bottom surface of the second TIM 1630, while the bottom surface of the second HC intermediate layer 1611 is directly attached to top surface 1605a of the die 1605. The semiconductor package 1600 also has dies 1605 disposed on the top surface 1601a of the substrate 1601. The bottom surface 1602b of the lid 1602 may be disposed on and above the first and second TIMs 1630-1631. Accordingly, for some embodiments, the lid 1602 is disposed above the TIMs 1630-1631, the HC intermediate layers 1610-1611, and the die 1605, respectively, on the substrate 1601, where the legs 1602c-d of the lid 1602 are attached to the substrate 1601 with a sealant 1625.

The present embodiments, as illustrated in FIG. 16A, enable one or more regions having different intermediate layers 1610-1611 and different TIM layers 1630-1631 with different materials. In addition, the present embodiments, as illustrated in FIGS. 16B and 16C, enable the HC intermediate layers 1630-1631 to be formed with one or more different patterns (e.g., patches, strips, rings, picture frames, etc.). For example, as shown in FIG. 16B of package 1600, the HC intermediate layers 1610-1611 may be formed as patches or strips of different intermediate layers, where the first HC intermediate layers 1610 are outer patches (or strips) and the second HC intermediate layer 1611 is an inner patch (or strip) surrounded by both the outer patches of the first HC intermediate layer 1610. Note that for this example, the TIMs 1631-1630 may respectively have the same patterns as the HC intermediate layers 1610-1611 (i.e., TIM 1631 has two outer patches surrounding an inner patch of TIM 1630).

Alternatively, as shown in FIG. 16C of package 1650 (which may be similar to package 1600 however with different intermediate and TIM layer patterns), the HC intermediate layers 1610-1611 may be formed in different configurations (e.g., a disk surrounded by a rectangular frame) of different intermediate layers, where the first HC intermediate layer 1610 is an outer rectangular frame with a circular hole in the middle, and the second HC intermediate layer 1611 is an inner disk that is surrounded by the outer rectangular frame of the first HC intermediate layer 1610. Note that for this example, the TIMs 1631-1630 may respectively have the same patterns as the HC intermediate layers 1610-1611 (i.e., TIM 1631 has an outer rectangular frame surrounding an inner disk of TIM 1630).

Accordingly and referring back to FIG. 16A, the HC intermediate layers 1610-1611 may be applied on different die backside 1605a locations to allow the use of different TIMs 1630-1631 in the same semiconductor package 1600. This can be advantageous to co-optimize thermals, cost and reliability for semiconductor packages (e.g., using a high-cost high conductivity TIM only in the vicinity of hotspot areas, while using a less-expensive lower conductivity TIM in other locations, or using different TIMs for the die center and edge to reduce edge degradation during reliability testing). Also note that, when TIMs with different thicknesses are to be used, the heights of the different HC intermediate layers/regions can also be tailored so that the sum of the HC intermediate layer height and corresponding TIM layer height is the same for different regions.

In addition, the lid 1602 may be mechanically (and/or thermally) coupled to the substrate 1601 with the sealant 1625. The sealant 1625 is formed between the top surface 1601a of the substrate 1601 and the bottom surfaces of the legs 1602c-d of the lid 1602.

For some embodiments, the first TIM 1631 may be disposed on the first HC intermediate layer 1610, coupling the bottom surface 1602b of the lid 1602 and the top surface of the first HC intermediate layer 1610. Likewise, for these embodiments, the second TIM 1630 may be disposed on the second HC intermediate layer 1611, coupling the bottom surface 1602b of the lid 1602 and the top surface of the second HC intermediate layer 1611.

Note that the semiconductor package 1600 may include fewer or additional packaging components based on the desired packaging design.

Figure 17:
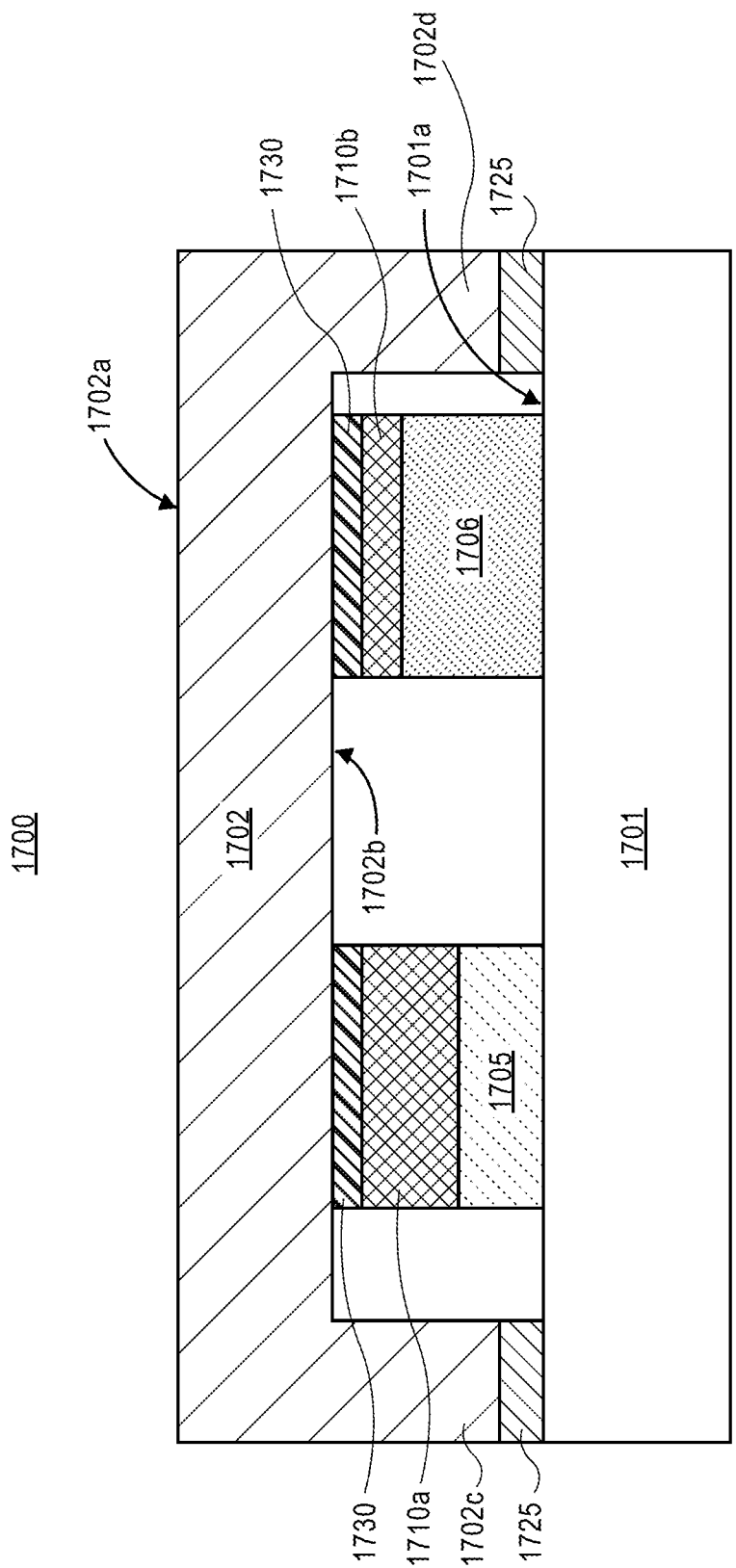
FIG. 17 is a cross-sectional view of a semiconductor package having a lid, one or more dies, one or more HC intermediate layers, one or more TIM layers, and a substrate, according to one embodiment.

FIG. 17 is a cross-sectional view of a semiconductor package 1700 having a lid 1702, one or more dies 1705-1706, a HC intermediate layer 1710, a TIM layer 1730, and a substrate 1701, according to one embodiment. Note that the semiconductor package 1700 of FIG. 17 is similar to the semiconductor packages of FIGS. 1-7, 9-13, and 15-16, however the semiconductor package 1700 is a MCP with dies 1705-1706 having different z-heights and HC intermediate layers 1710a-b having different z-heights to accommodate for the die z-height mismatch.

Referring now to FIG. 17, the semiconductor package 1700 includes the HC intermediate layer 1710a disposed on die 1705 and the HC intermediate layer 1710b disposed on die 1706. For one embodiment, the HC intermediate layer 1710a is disposed between the die 1705 and the TIM 1730, while the HC intermediate layer 1710b is disposed between the die 1706 and the TIM 1730. The semiconductor package 1700 further includes a lid 1702 having a top surface 1702a and a bottom surface 1702b. For some embodiments, the lid 1702 may be a flat lid with legs 1702c-d on the outer periphery of the lid 1702.

In addition, the semiconductor package 1700 also has dies 1705-1706 disposed on the top surface 1701a of the substrate 1701, where the z-height of die 1705 is smaller than the z-height of die 1706. To accommodate for the die z-height mismatch, the semiconductor package forms the HC intermediate layer 1710a to have a z-height which is greater than a z-height of the HC intermediate layer 1710b.

For one embodiment, the top surface of the HC intermediate layer 1710a is directly attached to the bottom surface of the TIM 1730, while the bottom surface of the HC intermediate layer 1710a is directly attached to the top surface of the die 1705. Likewise, the top surface the HC intermediate layer 1710b is directly attached to the bottom surface of the TIM 1730, while the bottom surface of the HC intermediate layer 1710b is directly attached to the top surface of the die 1706. The bottom surface 1702b of the lid 1702 may be disposed above the TIMs 1730, the HC intermediate layer 1710a-b, and the die 1705-1706, respectively, on the substrate 1701, where the legs 1702c-d of the lid 1702 are attached to the substrate 1701 with a sealant 1725.

The present embodiments, as illustrated in FIG. 17, facilitate MCPs (e.g., semiconductor package 1700) with one or more dies 1705-1706 placed adjacent to each other on the substrate 1701. In particular, this can be advantageous as dies 1705-1706 have different z-heights. For example, rather than accommodating the z-height difference using additional TIM, the HC intermediate layers 1710a and 1710b can be deposited with different thicknesses (or z-heights) on the dies 1705-1706, respectively, to create a level surface over which the TIM layer 1730 (or a thin, uniform TIM) can be applied. Additionally, this can be advantageous as the HC intermediate layers 1710a-b can have thermal conductivity remarkably higher than that of the TIM 1730, as such any thick region needed to accommodate for the z-height differences between the dies 1705-1706 would have a lower thermal resistance when constructed using the AD materials of the HC intermediate layers 1710a-b rather than the materials of TIM 1730.

For one embodiment, the HC intermediate layers 1710a-b may be formed as large rectangles to match the die shadows of dies 1705-1706. For other embodiments, the HC intermediate layers 1710a-b can be patterned with one or more different shapes and sizes (as shown in FIGS. 16B and 16C) based on the desired package design. In addition, the lid 1702 may be mechanically (and/or thermally) coupled to the substrate 1701 with the sealant 1725. The sealant 1725 is formed between the top surface 1701a of the substrate 1701 and the bottom surfaces of the legs 1702c-d of the lid 1702.

For some embodiments, the TIM 1730 may be formed on the HC intermediate layers 1710a-b, coupling the bottom surface 1702b of the lid 1702 to the top surfaces of the HC intermediate layers 1710a and 1710b. For one embodiment, the BLT of the TIM 1730 above HC layer 1710a is similar or equal to the BLT of the TIM 1730 above HC layer 1710b. For other embodiments, the BLTs of the TIMs 1730 above HC layers 1710a and 1710b may be different.

Note that the semiconductor package 1700 may include fewer or additional packaging components based on the desired packaging design.

Figure 18:
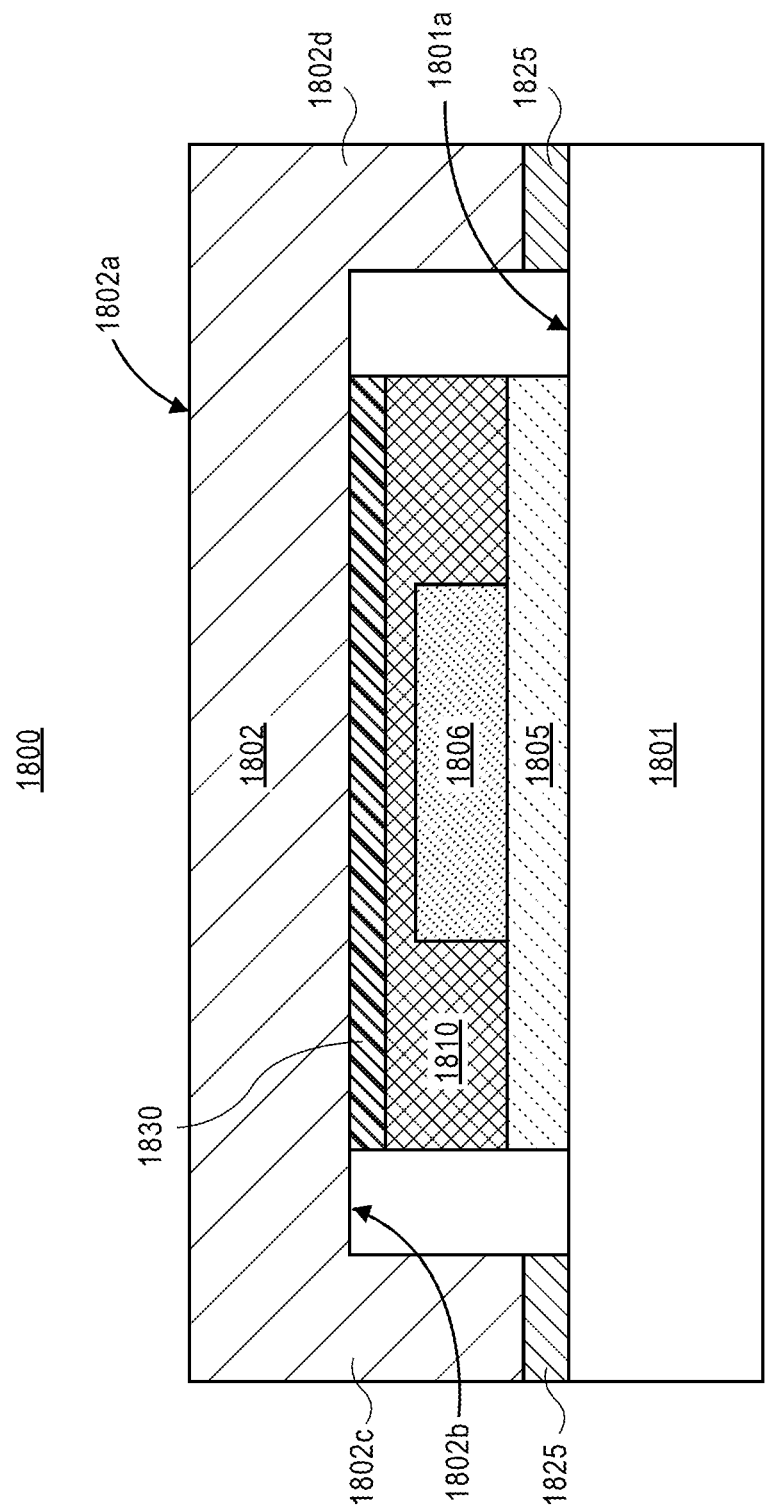
FIG. 18 is a cross-sectional view of a semiconductor package having a lid, one or more stacked dies, one or more HC intermediate layers, one or more TIM layers, and a substrate, according to one embodiment.

FIG. 18 is a cross-sectional view of a semiconductor package 1800 having a lid 1802, one or more stacked dies 1805-1806, a HC intermediate layer 1810, a TIM layer 1830, and a substrate 1801, according to one embodiment. Note that the semiconductor package 1800 of FIG. 18 is similar to the semiconductor packages of FIGS. 1-7, 9-13, and 15-17, however the semiconductor package 1800 is a MCP with dies 1805-1806 having different z-heights and vertically stacked, where the die 1806 is thus embedded in the HC intermediate layer 1810.

Referring now to FIG. 18, the semiconductor package 1800 has die 1805 disposed on the top surface 1801a of the substrate 1801 and die 1806 is vertically stacked (or disposed on) the top surface of the die 1805. For some embodiments, the dies 1805-1806 may have similar or different z-heights. In addition, the semiconductor package 1800 includes the HC intermediate layer 1810 disposed over and around die 1806, while the HC intermediate layer 1810 is disposed on the exposed top surface of die 1805. For one embodiment, the HC intermediate layer 1810 is disposed between the stacked dies 1805-1806 and the TIM 1830. The semiconductor package 1700 further includes a lid 1802 having a top surface 1802a and a bottom surface 1802b. For some embodiments, the lid 1802 may be a flat lid with legs 1802c-d on the outer periphery of the lid 1702.

For one embodiment, the top surface of the HC intermediate layer 1810 is directly attached to the bottom surface of the TIM 1830, while the bottom surface of the HC intermediate layer 1810 is directly attached to the entire top surface of die 1806 and the exposed top surface of die 1805. The bottom surface 1802b of the lid 1802 may be disposed above the TIM 1830, the HC intermediate layer 1810, and the stacked dies 1805-1806, respectively, on the substrate 1801, where the legs 1802c-d of the lid 1802 are attached to the substrate 1801 with a sealant 1825.

For one embodiment, the HC intermediate layer 1810 may be deposited/patterned as a large rectangular enclosure (or lid) to match the die shadows of stacked dies 1805-1806. For other embodiments, the HC intermediate layer 1810 can be patterned with one or more different shapes and sizes (as shown in FIGS. 16B and 16C) based on the desired package design. In addition, the lid 1802 may be mechanically (and/or thermally) coupled to the substrate 1801 with the sealant 1825. The sealant 1825 is formed between the top surface 1801a of the substrate 1801 and the bottom surfaces of the legs 1802c-d of the lid 1802.

For some embodiments, the TIM 1830 may be formed on the HC intermediate layer 1810, coupling the bottom surface 1802b of the lid 1802 and the top surface of the HC intermediate layer 1810.

Note that the semiconductor package 1800 may include fewer or additional packaging components based on the desired packaging design.

Figure 19:
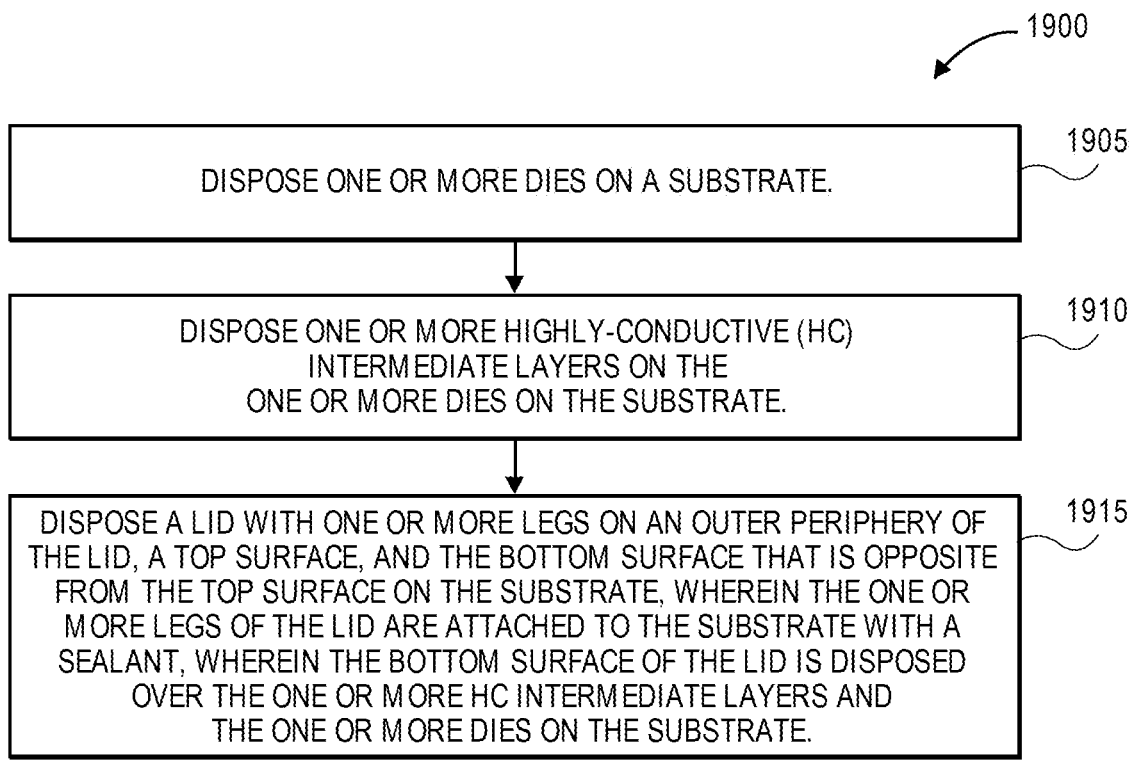
FIG. 19 is a process flow illustrating a method of forming a semiconductor package having a lid, one or more dies, one or more HC intermediate layers, one or more TIM layers, and a substrate, according to one embodiment.

FIG. 19 is a process flow illustrating a method of forming a semiconductor package having a lid, one or more dies, one or more HC intermediate layers, one or more TIM layers, and a substrate, according to one embodiment. Process flow 1900 illustrates a method of forming the semiconductor package. For example, process flow 1900 shows a method of forming a semiconductor package as shown in FIGS. 15-18, using for example AM processes such as cold spray.

At block 1905, the process flow 1900 disposes one or more dies on a substrate (as shown in FIGS. 15-18). At block 1910, the process flow 1900 disposes one or more highly-conductive (HC) intermediate layers on the one or more dies on the substrate (as shown in FIGS. 15-18). At block 1915, the process flow 1900 then disposes a lid with one or more legs on an outer periphery of the lid, a top surface, and a bottom surface that is opposite from the top surface on the substrate, wherein the one or more legs of the lid are attached to the substrate with a sealant, wherein the bottom surface of the lid is disposed over the one or more HC intermediate layers and the one or more dies on the substrate (as shown in FIGS. 15-18). For some embodiments, the process flow may also dispose one or more TIM layers above the one or more HC intermediate layers (as shown in FIGS. 15-18).

Note that the semiconductor package formed by process flow 1900 may include fewer or additional packaging components based on the desired packaging design.

FIGS. 20-27 illustrate embodiments of semiconductor packages with one or more interconnects between stacked substrates and/or dies using high throughput additive deposition. Specifically, these embodiments use high throughput additive manufacturing techniques (e.g., as described in detail above) to dispose additively manufactured (AM) interconnects between stacked substrates and/or dies, electrically coupling one substrate/die to another substrate/die. For example, the embodiments described below (e.g., as shown in FIGS. 20-27) utilize AM technologies, such as cold spray, to simultaneously deposit and pattern materials at a fast rate to form the AM interconnects—with good adhesion to the underlying substrate/die—and without the need for assembly (e.g., PnP), lithography, or plating steps.

As used herein, an "interconnect" (also referred to as an AM interconnect) refers to an additively manufactured electrical interconnect or via directly disposed on a substrate and/or a die using a high throughput deposition process and without the use of any intermediate adhesive layer. The interconnect(s) are formed directly on the substrate and/or the die (e.g., a top surface of a substrate coupled to another substrate, and/or a top surface of a die coupled to another die or substrate). For example, the interconnects can provide compact and novel electrical connections for three-dimensional (3D) stacked package architectures without needing to use interposers, solder-filled TMVs, or copper-plated TMVs. Note that wire bond dies and other passives or actives may be attached/connected to the AM interconnects directly on the mold surface.

For some embodiments, the stacked packages may have one or more interconnects directly disposed on the substrates, top of the dies, or other components in the packages. These embodiments are formed by depositing and patterning the interconnects in a single step using one or more materials (e.g., metal, solder, etc.). For example, in cold spray, the one or more materials (or powders of the materials) to be deposited are accelerated through a nozzle at high speeds, forming a mechanical bond upon impact with the substrate and/or the die. For some embodiments, these interconnects are patterned by controlling the nozzle dimensions and movement, and/or by spraying the materials/powders through a shadow mask with the desired features. For one embodiment, the interconnects may be formed with multi-layers of differing cold spray materials of non-equivalent thicknesses. For one embodiment, the interconnects may include magnetic cold spray materials as well.

This approach allows flexibility in material choice as multiple materials/powders can be combined and used to create features with optimized (or desired) electrical and thermomechanical properties. In addition, these embodiments of the interconnects allows in-situ deposition and patterning of multiple materials (e.g., Cu, Sn, etc.) on substrates, dies, passives, etc., thus eliminating the need for lithography steps. Note that these interconnects may be disposed on the substrate/die at a fast deposition rate (e.g., 100s of microns of material(s) can be deposited in seconds). The interconnects can be disposed at panel, wafer, strip, or unit level.

According to some embodiments, disposing interconnects directly on a substrate and a die using AD techniques, such as cold spray, has several significant advantages and unique capabilities compared to other typically used packaging solutions/approaches. In particular, several of the advantages of the present embodiments (e.g., as shown in FIGS. 20-27) include: (i) the interconnects can be directly deposited on the substrates or other package components without requiring resist lamination, lithography, or plating; (ii) the interconnects may be disposed more compactly and quickly on the substrate or other package components compared to assembling discrete interposers (or via bars); (iii) the interconnects are cost-efficient as they can be deposited at a fast rate and patterned simultaneously and hence do not require expensive lithography steps or equipment; (iv) the interconnects enable flexibility in material choices as multiple material powders can be combined and used to form features with the desired electrical and thermomechanical properties on substrates, dies, passives, and/or any other package components.

Figure 20:
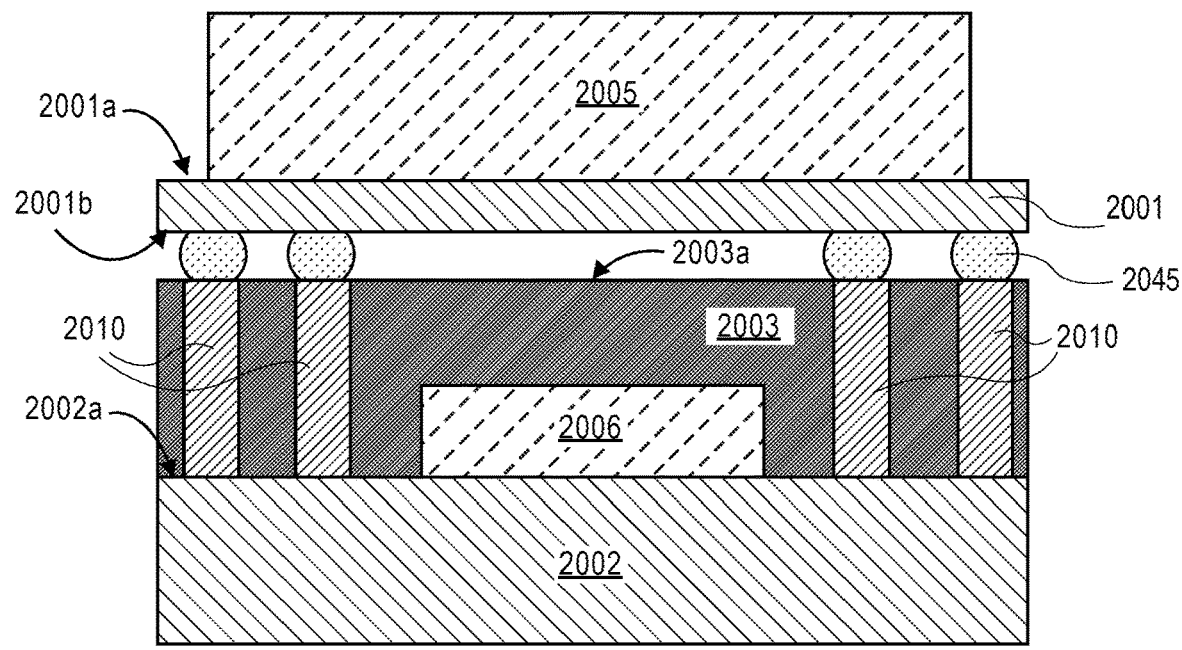
FIG. 20 is a cross-sectional view of a semiconductor package with one or more dies, a mold layer, one or more interconnects, and one or more substrates, according to one embodiment.

FIG. 20 is a cross-sectional view of a semiconductor package 2000 with one or more dies 2005-2006, a mold layer 2003, one or more interconnects 2010, and one or more substrates 2001-2002, according to one embodiment. Note that the semiconductor package 2000 of FIG. 20 has the one or more interconnects 2010 directly disposed on the substrates 2002 without any adhesive layer and electrically coupling each of the substrates 2001-2002, however the semiconductor package 2000 may include fewer or additional packaging components (e.g., as shown in FIGS. 1-19) based on the desired packaging design.

For some embodiments, the semiconductor package 2000 includes one or more dies 2006 disposed on a first substrate 2002. For one embodiment, the first substrate 2002 is part of a bottom package. The semiconductor package 2000 further includes one or more interconnects 2010 vertically disposed on a top surface 2002a of the first substrate 2002. For some embodiments, the interconnects 2010 may be disposed on any surface in any axis—not only in a vertical direction—and may have one or more different thicknesses, shapes, and/or heights (i.e., each of the interconnects may be different from each other within the same package).

Figure 21:
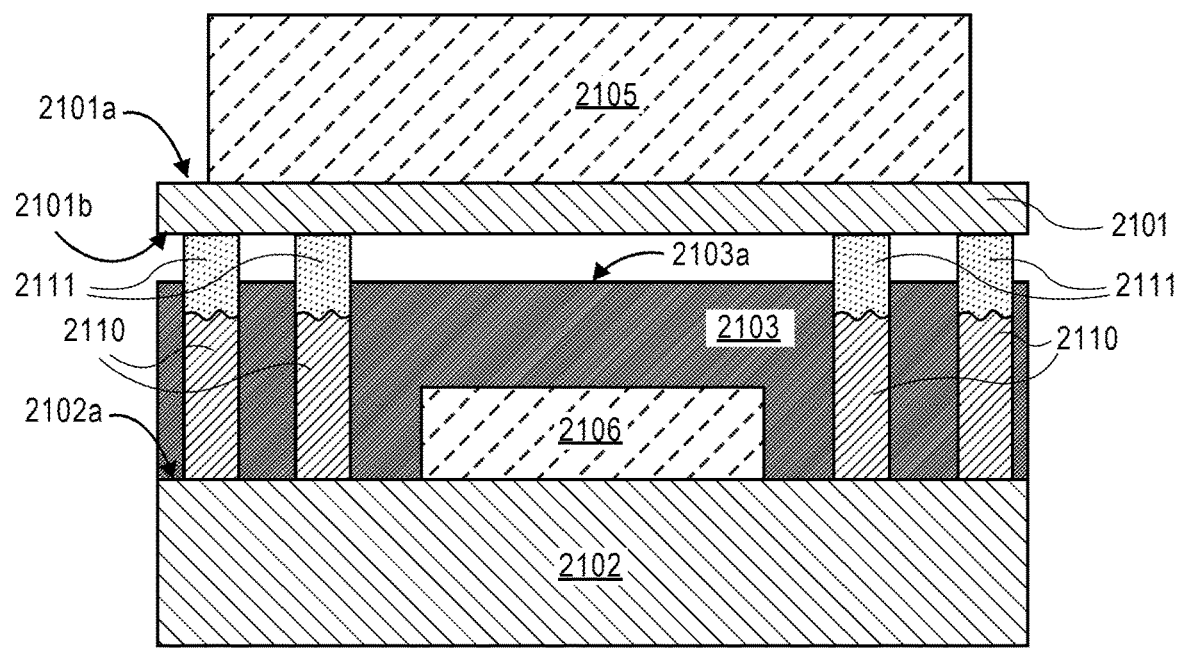
FIG. 21 is a cross-sectional view of a semiconductor package with one or more dies, a mold layer, one or more interconnects, one or more joints, and one or more substrates, according to one embodiment.

In addition, the semiconductor package 2000 may include a mold layer 2003 disposed over and around the one or more dies 2006, the one or more interconnects 2010, and the first substrate 2002. For some embodiments, the semiconductor package 2000 includes a second die 2005 disposed on a top surface 2001a of a second substrate 2001. For one embodiment, the second substrate 2001 is part of a top package. The first substrate 2002 may be electrically coupled to the second substrate 2001 with the one or more interconnects 2010. In addition, for example, the one or more interconnects 2010 may be directly disposed on the top surface 2002a of the first substrate 2002 (as shown in FIG. 20) and/or a bottom surface 2001b of the second substrate 2001 (as shown in FIG. 21) without any adhesive layer.

For one embodiment, one or more top surfaces of the interconnects 2010 may be exposed along a top surface 2003a of the mold layer 2003. In one embodiment, the exposed top surfaces of the interconnects 2010 are electrically coupled to one or more solder balls 2045 that are disposed on the bottom surface 2001b of the second substrate 2001. For example, for one embodiment, the interconnects 2010 are directly disposed on the first substrate 2002, while the one or more solder balls 2045 are subsequently attached and reflowed to form joints that electrically couple substrates 2001-2002.

As shown in FIG. 20, the one or more interconnects 2010 are formed as AM through mold interconnects between the first substrate 2002 and the second substrate 2001. The interconnects 2010 can be formed using any conductive material such as copper, aluminum, etc. In addition, although the interconnects 2010 are shown as a uniform layer, the interconnects 2010 may also include mixed particles of one or more materials, or of one or more different layers having different materials (e.g., a layer of Nickel, followed by a layer of Cu, etc.). The different materials, however, can all be deposited using the same or similar additive processes and using the same shadow mask or stencil if needed.

Note that the semiconductor package 2000 may include fewer or additional packaging components based on the desired packaging design.

FIG. 21 is a cross-sectional view of a semiconductor package 2100 with one or more dies 2105-2106, a mold layer 2103, one or more interconnects 2110, one or more joints 2111, and one or more substrates 2101-2102, according to one embodiment. Note that the semiconductor package 2100 of FIG. 21 is similar to the semiconductor package 2000 of FIG. 20, however the semiconductor package 2100 has one or more interconnects 2110 and one or more solder joints 2111 disposed between the first substrate 2102 and the second substrate 2101. Note, that for some alternative embodiments, the joints can be additively deposited after the one or more interconnects 2110 are disposed on the first substrate 2102, thus eliminating the need for a separate ball attach step to add the solder balls (e.g., solder balls 2045 of FIG. 20).

The semiconductor package 2100 includes one or more dies 2106 disposed on a first substrate 2102. For one embodiment, the first substrate 2102 is part of a bottom package. The semiconductor package 2100 further includes one or more interconnects 2110 vertically disposed on a top surface 2102a of the first substrate 2102. The semiconductor package 2100 may include a mold layer 2103 disposed over and around the one or more dies 2106, the one or more interconnects 2110, and the first substrate 2102.

For some embodiments, the semiconductor package 2100 includes a second die 2105 disposed on a top surface 2101a of a second substrate 2101. For one embodiment, the second substrate 2101 is part of a top package. The first substrate 2102 may be electrically coupled to the second substrate 2101 with the one or more interconnects 2110 and the one or more joints 2111 (also referred to as AM joints).

For some embodiments, the solder joints 2111 may be formed with the same and/or similar AM process as the interconnects 2110, such as cold spray. For one embodiment, the joints 2111 may be directly disposed on top surfaces of the interconnects 2110 and/or directly on a bottom surface 2101b of the second substrate 2101. In addition, for example, the interconnects 2110 and the joints 2111 may be directly disposed on their respective surfaces without any adhesive layer.

Note that the semiconductor package 2100 may include fewer or additional packaging components based on the desired packaging design.

Figure 22:
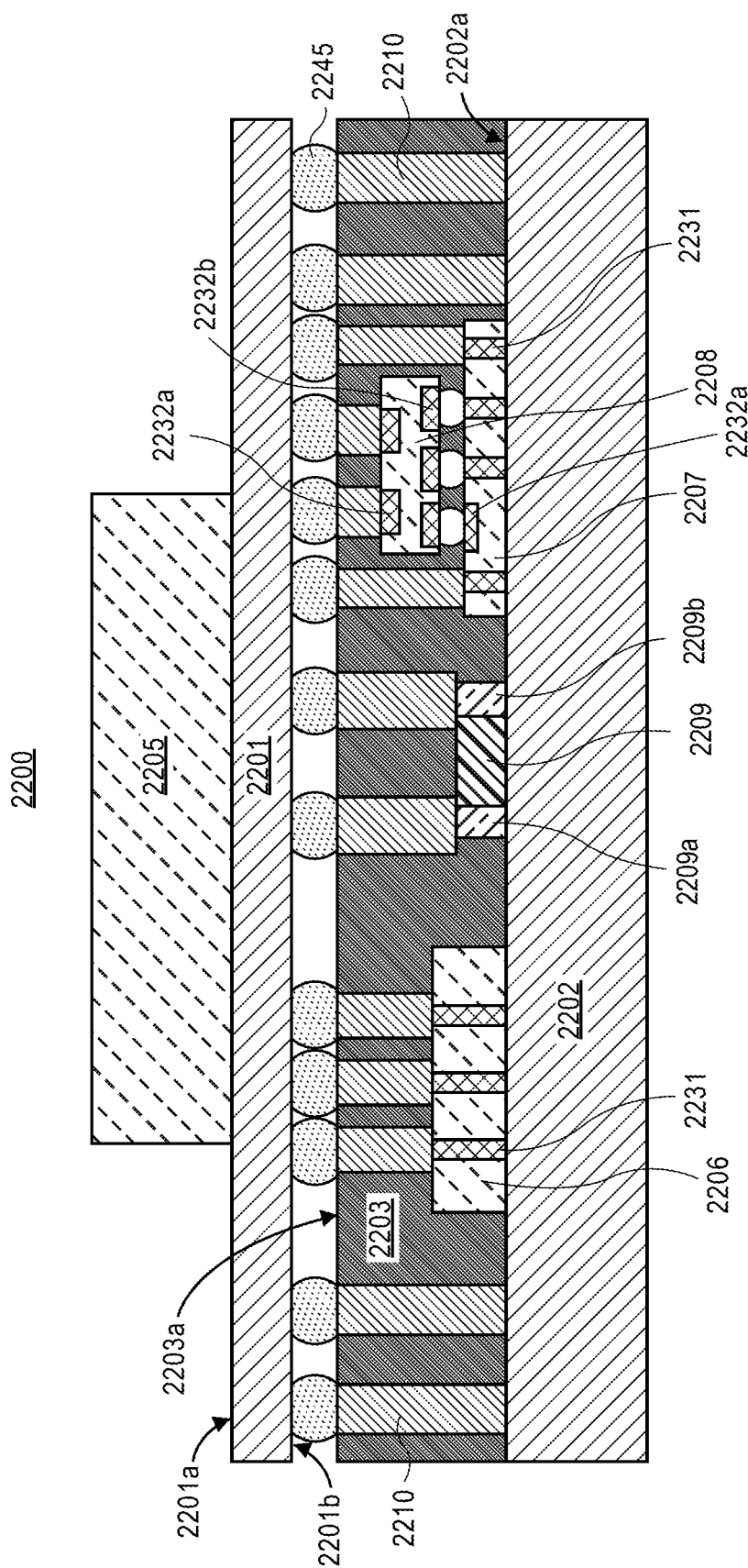
FIG. 22 is a cross-sectional view of a semiconductor package with one or more dies, one or more electrical components, a mold layer, one or more interconnects, and one or more substrates, according to one embodiment.

FIG. 22 is a cross-sectional view of a semiconductor package 2200 with one or more dies 2205-2208, one or more electrical components 2209, a mold layer 2203, one or more interconnects 2210, and one or more substrates 2201-2202, according to one embodiment. Note that the semiconductor package 2200 of FIG. 22 is similar to the semiconductor packages of FIGS. 20-21, however the semiconductor package 2200 has one or more interconnects 2210 of varying heights disposed on the first substrate 2202 and on one or more dies 2205-2208 and electrical components (e.g., a surface mount component, such as a capacitor, an inductor, a resistor, or any other passive components) 2209 that are disposed on the first substrate 2202.

For some embodiments, the semiconductor package 2200 includes one or more dies 2205-2208 disposed on the first substrate 2202. The semiconductor package 2200 further includes one or more interconnects 2210 vertically disposed on a top surface 2202a of the first substrate 2202, a top surface of the die 2206, a top surface of the electrical components 2209, and on top surfaces of the dies 2207-2208. As shown in FIG. 22, the one or more interconnects 2210 have one or more different z-heights and are disposed on one or more different surfaces, including one or more die pads 2232a, one or more through silicon vias (TSVs) 2231, and one or more edge terminals 2209a-b.

In addition, the semiconductor package 2200 may include a mold layer 2203 disposed over and around the one or more dies and electrical components 2206-2209, the one or more interconnects 2210, and the first substrate 2202. For some embodiments, the semiconductor package 2200 includes a second die 2205 disposed on a top surface 2201a of a second substrate 2201. The first substrate 2202 may be electrically coupled to the second substrate 2201 with the one or more interconnects 2210. In addition, for example, the one or more interconnects 2210 may be directly disposed on the top surface 2202a of the first substrate 2202 without any adhesive layer.

For one embodiment, one or more top surfaces of the interconnects 2210 may be exposed along a top surface 2203a of the mold layer 2303. In one embodiment, the exposed top surfaces of the interconnects 2210 are electrically coupled to one or more solder balls 2245 that are disposed on the bottom surface 2201b of the second substrate 2201. For example, for one embodiment, the interconnects 2210 are directly disposed on the first substrate 2202, while the one or more solder balls 2245 are subsequently attached and reflowed to form joints that electrically couple substrates 2201-2202.

As shown in FIG. 22, the one or more interconnects 2210 may be directly disposed on top of one or more die/components 2206-2209 in the package 2200 in addition to the interconnects 2210 also directly disposed on top of the first substrate 2202. This can be advantageous for components such as dies 2206 and 2207 with TSVs 2231, dies 2207 with top sided connections 2232a or dies 2208 with top and bottom sided connections 2232a-b respectively, vertically stacked dies 2207-2208 or components, and surface mount components 2209, such as passives that have terminals 2209a-b that span the edges of both their top and bottom sides. Note that each of these components 2206-2209 and interconnects 2210 may have different heights. These embodiments described herein enable the disposition of electrical interconnects/vias directly between those components and the top substrate, instead of having to initially route the signals from those components through the bottom package substrate. This can have power and performance benefits for the semiconductor package 2200 (e.g., reduce resistive/inductive impedances in the signal path as well as latency.)

Note that the semiconductor package 2200 may include fewer or additional packaging components based on the desired packaging design.

Figure 23:
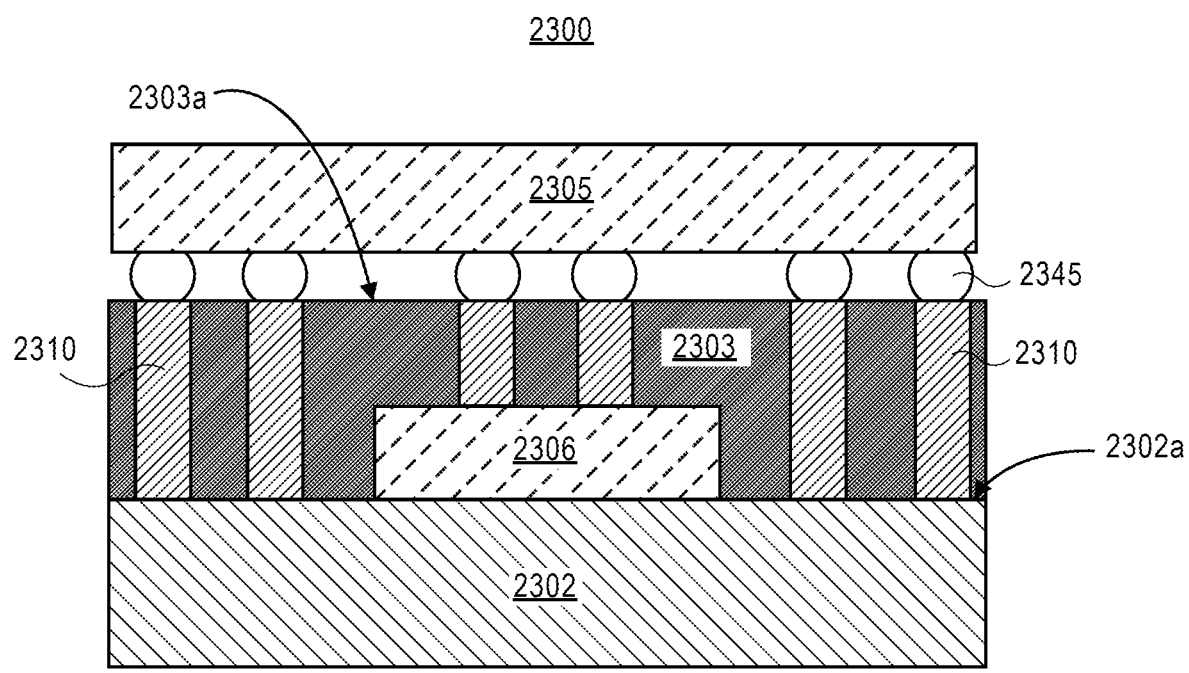
FIG. 23 is a cross-sectional view of a semiconductor package with one or more dies, a mold layer, one or more interconnects, and one or more substrates, according to one embodiment.

FIG. 23 is a cross-sectional view of a semiconductor package 2300 with one or more dies 2305-2306, a mold layer 2303, one or more interconnects 2310, and a first substrate 2302, according to one embodiment. Note that the semiconductor package 2300 of FIG. 23 is similar to the semiconductor packages of FIGS. 20-22, however the semiconductor package 2300 has the interconnects 2310 disposed between the first substrate 2302 and the die 2305 (i.e., a top bare die, omitting a second substrate).

For some embodiments, the semiconductor package 2300 includes one or more dies 2306 disposed on the first substrate 2302. The semiconductor package 2300 further includes one or more interconnects 2310 vertically disposed on a top surface 2302a of the first substrate 2302. In addition, the semiconductor package 2300 may include a mold layer 2303 disposed over and around the one or more dies 2306, the one or more interconnects 2310, and the first substrate 2302. For some embodiments, the semiconductor package 2300 includes a second die 2305 disposed on a top surface 2303a of the mold layer 2303, where the first substrate 2302 may be electrically coupled to the second die 2305 with the one or more interconnects 2310.

For one embodiment, one or more top surfaces of the interconnects 2310 may be exposed along the top surface 2303a of the mold layer 2303. In one embodiment, the exposed top surfaces of the interconnects 2310 are electrically coupled to one or more solder balls or bumps 2345 that are disposed on the bottom surface of the second die 2305. For example, for one embodiment, the interconnects 2310 are directly disposed on the first substrate 2302, while the one or more solder balls or bumps 2345 are subsequently attached and reflowed to form joints that electrically couple the first substrate 2302 and the second die 2305.

Note, that although the above embodiments are shown for packages with a single-flip chip die, multiple dies arranged laterally, or two vertically stacked dies, other embodiments enable other types of package architectures (for both top and bottom packages). These other embodiments may include packages with two or more 3D stacked dies, packages with wire bonded dies, packages with or without mold layers, bare die packages, etc.

Also note that the semiconductor package 2300 may include fewer or additional packaging components based on the desired packaging design.

Figure 24:
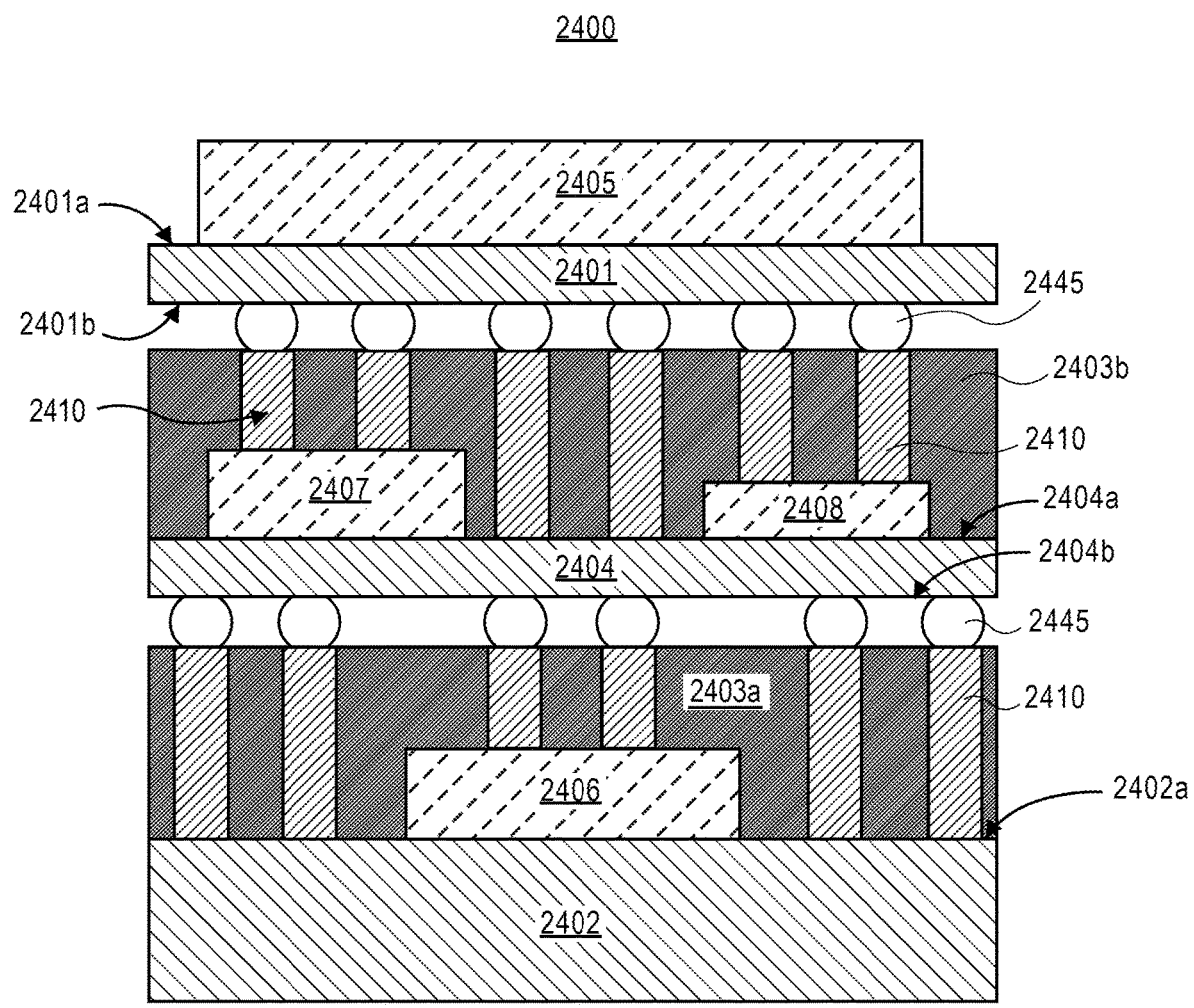
FIG. 24 is a cross-sectional view of a semiconductor package with one or more dies, one or more mold layers, one or more interconnects, and one or more substrates, according to one embodiment.

FIG. 24 is a cross-sectional view of a semiconductor package 2400 with one or more dies 2405-2408, one or more mold layers 2403a-b, one or more interconnects 2410, and one or more substrates 2401-2402 and 2404, according to one embodiment. Note that the semiconductor package 2400 of FIG. 24 is similar to the semiconductor packages of FIGS. 20-23, however the semiconductor package 2400 has one or more interconnects 2410 disposed between two or more substrates 2401, 2402, and 2404.

For some embodiments, the semiconductor package 2400 includes one or more dies 2406 disposed on a first substrate 2402, one or more dies 2407-2408 disposed on a second substrate 2404, and one or more dies 2405 disposed on a third substrate 2401. For one embodiment, the first substrate 2402 is part of a bottom package, the second substrate 2404 is part of a middle package, and the third substrate 2401 is part of a top package. The semiconductor package 2400 further includes one or more interconnects 2410 vertically disposed on a top surface 2402a of the first substrate 2402 and a top surface 2404a of the second substrate 2404.

In addition, the semiconductor package 2400 may include a first mold layer 2403a disposed over and around the one or more dies 2406, the one or more interconnects 2410, and the first substrate 2402; and a second mold layer 2403b disposed over and around the one or more dies 2407-2408, the one or more interconnects 2410, and the second substrate 2404. For one embodiment, each of the substrates 2401-2402 and 2404 is electrically coupled to the other substrates 2401-2402 and 2404 with the one or more interconnects 2410.

For one embodiment, one or more top surfaces of the interconnects 2410 may be exposed along top surfaces of the mold layers 2403a-b. In one embodiment, the exposed top surfaces of the interconnects 2410 are electrically coupled to one or more sets of solder balls 2445 that are disposed on a bottom surface 2401b of the third substrate 2401 and a bottom surface 2404b of the second substrate 2404. For example, for some embodiments, the interconnects 2410 are directly disposed on the first and second substrates 2402 and 2404, while the one or more solder balls 2445 are subse-quently attached and reflowed to form joints that electrically couple all three substrates 2401-2402 and 2404.

Note that the semiconductor package 2400 may include fewer or additional packaging components based on the desired packaging design.

Figure 25B:
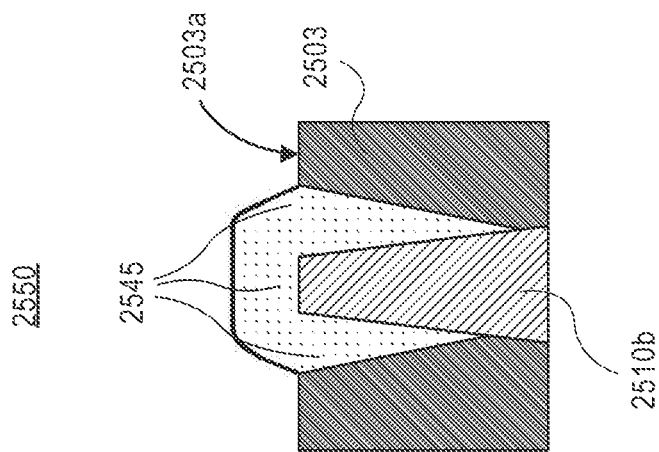
FIGS. 25A and 25B are cross-sectional views of one or more interconnects with tapered shapes disposed in a mold layer, according to some embodiments.
Figure 25A:
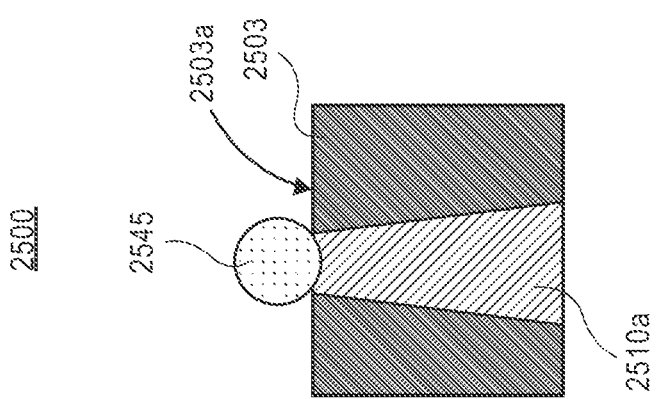

FIGS. 25A and 25B are cross-sectional views of one or more packages 2500 and 2550 with one or more interconnects/vias 2510a-b, respectively, with tapered shapes disposed in a mold layer 2503, according to some embodiments. For example, FIG. 25A shows a tapered additively manufactured via 2510a formed prior to molding, with a solder ball 2545 disposed on the via along a top surface 2503a of the mold layer 2503. Meanwhile, FIG. 25B shows a tapered additively manufactured via 2510b formed after molding and cavity creation in the mold, with a solder joint 2545 additively deposited into the remaining mold cavity on the sides of the via as well as on top of the via. For example, although the interconnects described in earlier sections may be shown as vertical (e.g., as shown in FIGS. 20-24), the vias/interconnects may actually have a tapered shape, as shown in FIGS. 25A and 25B.

Note that the semiconductor packages 2500 and 2550 may include fewer or additional packaging components based on the desired packaging design.

Figure 26:
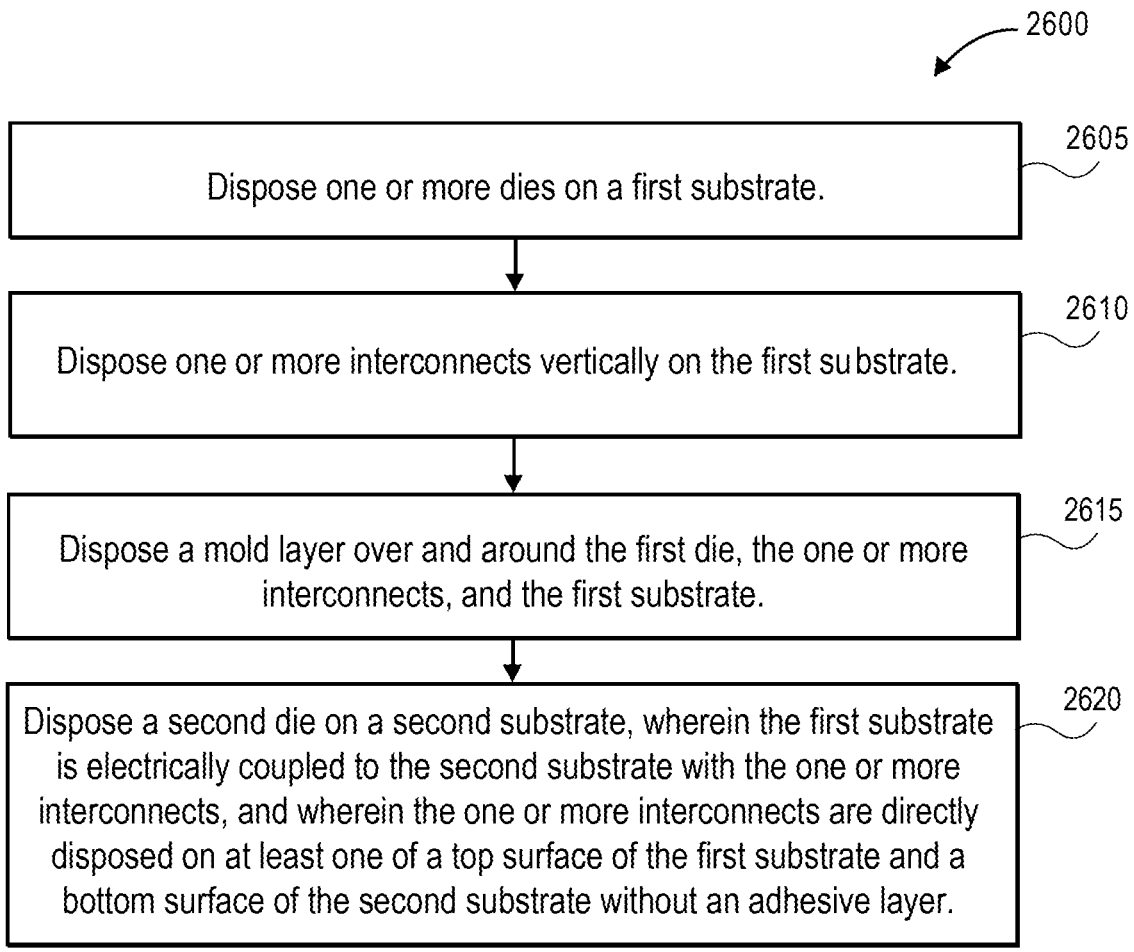
FIG. 26 is a process flow illustrating a method of forming a semiconductor package with one or more dies, one or more mold layers, one or more interconnects, and one or more substrates, according to one embodiment.

FIG. 26 is a process flow illustrating a method of forming a semiconductor package with one or more dies, one or more mold layers, one or more interconnects, and one or more substrates, according to one embodiment. Process flow 2600 illustrates a method of forming the semiconductor package. For example, process flow 2600 shows a method of forming semiconductor packages as shown in FIGS. 20-25, using for example AM processes such as cold spray.

At block 2605, the process flow 2600 disposes one or more dies on a first substrate (as shown in FIGS. 20-24). At block 2610, the process flow 2600 disposes one or more interconnects vertically on the first substrate (as shown in FIGS. 20-24). At block 2615, the process flow 2600 disposes a mold layer over and around the first die, the one or more interconnects, and the first substrate (as shown in FIGS. 20-24). At block 2620, the process flow 2600 disposes a second die on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer (as shown in FIGS. 20-24).

For one embodiment, the process flow may include the additively manufactured electrical interconnects (or vias) directly disposed on a top surface of the substrate and/or a top surface of the one or more dies/components without an adhesive layer. For another embodiment, the process flow may have the interconnects disposed with one or more different thicknesses, shapes, and heights. Likewise, for another embodiment, the process flow may have the interconnects made from one or more different materials, such as, metals, metal alloys, metal/ceramic composites, and/or any combination thereof.

For some embodiments, the process flow may dispose the one or more interconnects directly on the substrates, dies, and electrical components using additive deposition techniques, such as the cold spraying process.

Note that the semiconductor package formed by process flow 2600 may include fewer or additional packaging components based on the desired packaging design.

Figure 27:
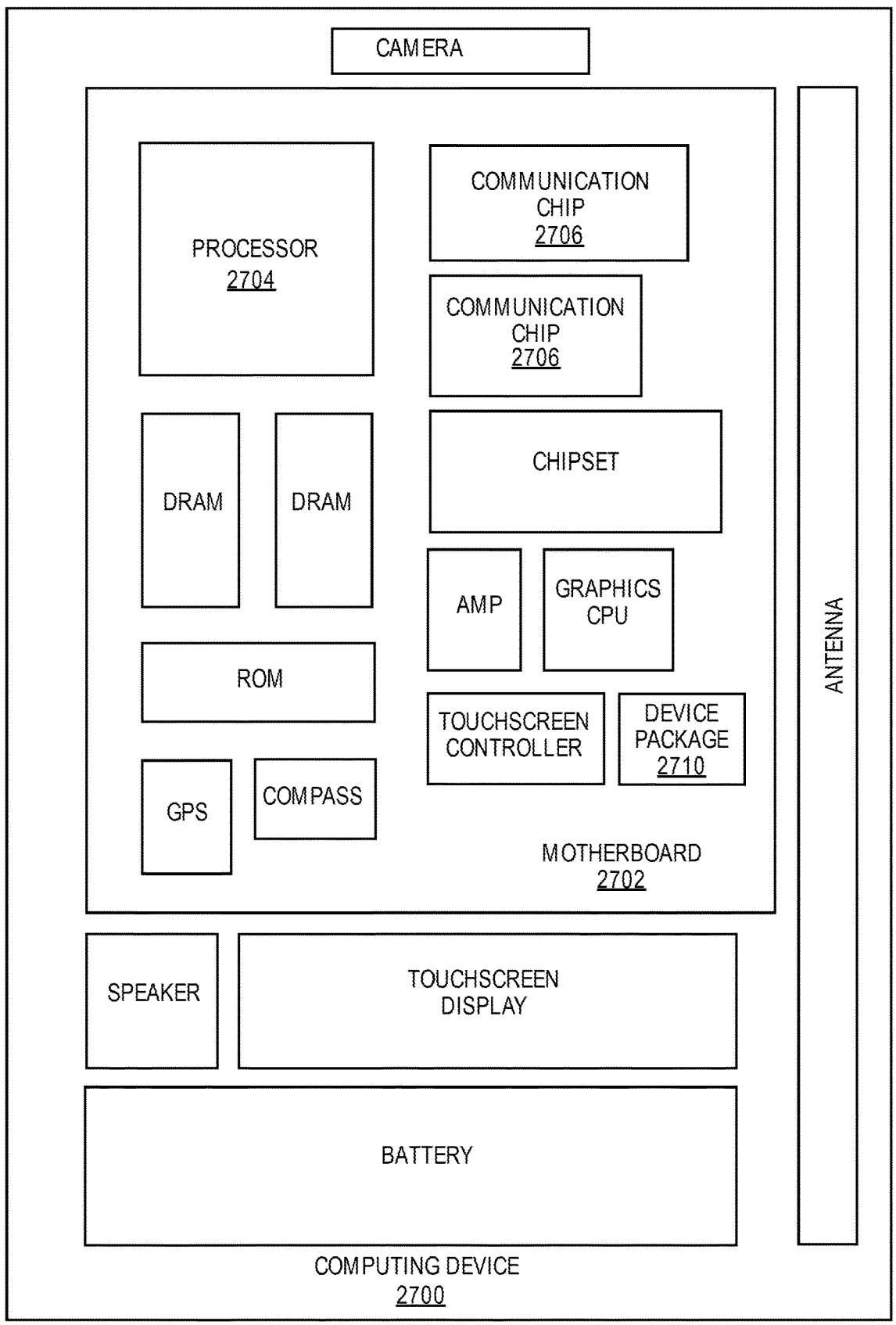
FIG. 27 is a schematic block diagram illustrating a computer system that utilizes a device package with one or more dies, one or more mold layers, one or more interconnects, and one or more substrates, according to one embodiment.

FIG. 27 is a schematic block diagram illustrating a computer system that utilizes a device package with one or more dies, one or more mold layers, one or more interconnects, and one or more substrates, as described herein. FIG. 27 illustrates an example of computing device 2700. Computing device 2700 houses motherboard 2702. Motherboard 2702 may include a number of components, including but not limited to processor 2704, device package 2710, and at least one communication chip 2706. Processor 2704 is physically and electrically coupled to motherboard 2702. For some embodiments, at least one communication chip 2706 is also physically and electrically coupled to motherboard 2702. For other embodiments, at least one communication chip 2706 is part of processor 2704.

Depending on its applications, computing device 2700 may include other components that may or may not be physically and electrically coupled to motherboard 2702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 2706 enables wireless communications for the transfer of data to and from computing device 2700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 2706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2700 may include a plurality of communication chips 2706. For instance, a first communication chip 2706 may be dedicated to shorter range wireless communications such as Wi-Fi and Bluetooth and a second communication chip 2706 may be dedicated to longer range wireless communications such as GPS, EDGE, GPRS, CDMA, WiMAX, LTE, Ev-DO, and others.

Processor 2704 of computing device 2700 includes an integrated circuit die packaged within processor 2704. Device package 2710 may be, but is not limited to, a packaging substrate and/or a printed circuit board. Device package 2710 may include one or more dies, one or more mold layers, one or more interconnects, and one or more substrates (as illustrated in FIGS. 20-26)—or any other components from the figures described herein—of the computing device 2700. Further, the device package 2710 may implement interconnects/vias between substrates using high throughput additive deposition methods, such as a cold spray process.

Note that device package 2710 may be a single component, a subset of components, and/or an entire system, as the AD materials, features, and components may be limited to device package 2710 and/or any other component that requires AD materials, features, and components.

For some embodiments, the integrated circuit die may be packaged with one or more devices on device package 2710 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 2706 also includes an integrated circuit die packaged within the communication chip 2706. For some embodiments, the integrated circuit die of the communication chip may be packaged with one or more devices on the device package 2710, as described herein.

The following examples pertain to further embodiments. The various features of the different embodiments may be variously combined with some features included and others excluded to suit a variety of different applications.

Example 1 is a device package, comprising one or more dies disposed on a first substrate; one or more interconnects vertically disposed on the first substrate; a mold layer disposed over and around the one or more dies, the one or more interconnects, and the first substrate; and a second die disposed on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer.

In example 2, the subject matter of example 1 can optionally include one or more solder materials directly disposed on the one or more interconnects to electrically couple the first substrate and the second substrate.

In example 3, the subject matter of any of examples 1-2 can optionally include the one or more interconnects having one or more different thicknesses or heights at different locations on the first substrate.

In example 4, the subject matter of any of examples 1-3 can optionally include that the one or more interconnects are directly disposed on at least one of the top surface of the first substrate and one or more top surfaces of one or more dies on the first substrate. The one or more interconnects are directly disposed on the top surface of the first substrate and the one or more dies using a cold spray process.

In example 5, the subject matter of any of examples 1-4 can optionally include the one or more interconnects having one or more exposed top surfaces along a top surface of the mold layer.

In example 6, the subject matter of any of examples 1-5 can optionally include one or more electrical components disposed on the first substrate. Each of the one or more electrical components has terminal edges electrically coupled to the interconnects. The one or more electrical components include capacitors, inductors, or resistors.

In example 7, the subject matter of any of examples 1-6 can optionally include that the one or more interconnects have one or more different materials, including metals, metal alloys, and metal and ceramic composites.

In example 8, the subject matter of any of examples 1-7 can optionally include that at least one of the one or more interconnects include at least one of one or more different shapes, including round interconnects, rectangular interconnects, and tapered interconnects. At least one of the one or more interconnects has multi-layers of one or more materials, including at least a first conductor material layer and a second semi-conductor material layer to form one or more bi-layers.

In example 9, the subject matter of any of examples 1-8 can optionally include that at least one of the first substrate and the second substrate is a printed circuit board.

Example 10 is a method of forming a device package, comprising disposing one or more dies on a first substrate; disposing one or more interconnects vertically on the first substrate; disposing a mold layer over and around the one or more dies, the one or more interconnects, and the first substrate; and disposing a second die on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer.

In example 11, the subject matter of example 10 can optionally include one or more solder materials directly disposed on the one or more interconnects to electrically couple the first substrate and the second substrate.

In example 12, the subject matter of any of examples 10-11 can optionally include that the one or more interconnects have one or more different thicknesses or heights at different locations on the first substrate.

In example 13, the subject matter of any of examples 10-12 can optionally include that the one or more interconnects are directly disposed on at least one of the top surface of the first substrate and one or more top surfaces of one or more dies on the first substrate. The one or more interconnects are directly disposed on the top surface of the first substrate and the one or more dies using a cold spray process.

In example 14, the subject matter of any of examples 10-13 can optionally include the one or more interconnects having one or more exposed top surfaces along a top surface of the mold layer.

In example 15, the subject matter of any of examples 10-14 can optionally include one or more electrical components disposed on the first substrate. Each of the one or more electrical components has terminal edges electrically coupled to the interconnects. The one or more electrical components include capacitors, inductors, or resistors.

In example 16, the subject matter of any of examples 10-15 can optionally include that the one or more interconnects include one or more different materials, including metals, metal alloys, and metal and ceramic composites.

In example 17, the subject matter of any of examples 10-16 can optionally include that at least one of the one or more interconnects include at least one of one or more different shapes, including round interconnects, rectangular interconnects, and tapered interconnects. At least one of the one or more interconnects has multi-layers of one or more materials, including at least a first conductor material layer and a second semi-conductor material layer to form one or more bi-layers.

In example 18, the subject matter of any of examples 10-17 can optionally include that at least one of the first substrate and the second substrate is a printed circuit board.

Example 19 is a device package, comprising a first set of one or more dies disposed on a first substrate; a first set of interconnects vertically disposed on the first substrate or one or more top surfaces of the first set of dies; a first mold layer disposed over and around the first set of dies, the first set of interconnects, and the first substrate; a second set of one or more dies disposed on a second substrate; a second set of interconnects vertically disposed on the second substrate or one or more top surfaces of the second set of dies; a second mold layer disposed over and around the second set of dies, the second set of interconnects, and the second substrate; and a third set of one or more dies disposed on a third substrate, wherein the first substrate is electrically coupled to the second and third substrates with the first and second set of interconnects, and wherein the first and second set of interconnects are directly disposed on the top surfaces of the first and second substrates or the top surfaces of the first and second set of dies without an adhesive layer.

In example 20, the subject matter of example 19 can optionally include a first set of one or more solder materials directly disposed on the one or more of the first set of interconnects to electrically couple the first substrate and the second substrate; and a second set of one or more solder materials directly disposed on the one or more of the second set of interconnects to electrically couple the second substrate and the third substrate.

In example 21, the subject matter of any of examples 19-20 can optionally include that the first and second set of interconnects have one or more different thicknesses or heights at different locations on the first substrate and second substrates. The first set of interconnects are directly disposed on at least one of the top surface of the first substrate and one or more top surfaces of one or more dies on the first substrate. The second set of interconnects are directly disposed on at least one of the top surface of the second substrate and one or more top surfaces of one or more dies on the second substrate. The first and second set of interconnects are directly disposed on the top surface of the first substrate and second substrate and the one or more dies using a cold spray process.

In example 22, the subject matter of any of examples 19-21 can optionally include that the first and second set of interconnects have one or more exposed top surfaces along a top surface of the mold layer.

In example 23, the subject matter of any of examples 19-22 can optionally include one or more electrical components disposed on at least one of the first substrate and the second substrate. Each of the one or more electrical components has terminal edges electrically coupled to the interconnects. The one or more electrical components include capacitors, inductors, or resistors.

In example 24, the subject matter of any of examples 19-23 can optionally include that the first and second set of interconnects include one or more different materials, including metals, metal alloys, and metal and ceramic composites.

In example 25, the subject matter of any of examples 19-24 can optionally include at least one of the first and second set of interconnects include at least one of one or more different shapes, including round interconnects, rectangular interconnects, and tapered interconnects. At least one of the first and second set of interconnects has multi-layers of one or more materials, including at least a first conductor material layer and a second semi-conductor material layer to form one or more bi-layers. At least one of the first substrate, the second substrate, and the third substrate is a printed circuit board.

In the foregoing specification, embodiments have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A device package, comprising:
   one or more dies disposed on a first substrate;
   one or more interconnects vertically disposed on the first substrate;
   a mold layer disposed over and around the one or more dies, the one or more interconnects, and the first substrate; and
   a second die disposed on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer.

2. The device package of claim 1, further comprising one or more solder materials directly disposed on the one or more interconnects to electrically couple the first substrate and the second substrate.

3. The device package of claim 1, wherein the one or more interconnects have one or more different thicknesses or heights at different locations on the first substrate.

4. The device package of claim 1, wherein the one or more interconnects are directly disposed on at least one of the top surface of the first substrate and one or more top surfaces of one or more dies on the first substrate, and wherein the one or more interconnects are directly disposed on the top surface of the first substrate and the one or more dies using a cold spray process.

5. The device package of claim 1, wherein the one or more interconnects have one or more exposed top surfaces along a top surface of the mold layer.

6. The device package of claim 1, further comprising one or more electrical components disposed on the first substrate, wherein each of the one or more electrical components has terminal edges electrically coupled to the interconnects, and wherein the one or more electrical components include capacitors, inductors, or resistors.

7. The device package of claim 1, wherein the one or more interconnects include one or more different materials, including metals, metal alloys, and metal and ceramic composites.

8. The device package of claim 1, wherein at least one of the one or more interconnects include at least one of one or more different shapes, including round interconnects, rectangular interconnects, and tapered interconnects, and wherein at least one of the one or more interconnects has multi-layers of one or more materials, including at least a first conductor material layer and a second semi-conductor material layer to form one or more bi-layers.

9. The device package of claim 1, wherein at least one of the first substrate and the second substrate is a printed circuit board.

10. A method of forming a device package, comprising:
    disposing one or more dies on a first substrate;
    disposing one or more interconnects vertically on the first substrate;
    disposing a mold layer over and around the one or more dies, the one or more interconnects, and the first substrate; and disposing a second die on a second substrate, wherein the first substrate is electrically coupled to the second substrate with the one or more interconnects, and wherein the one or more interconnects are directly disposed on at least one of a top surface of the first substrate and a bottom surface of the second substrate without an adhesive layer.

11. The method of claim 10, further comprising one or more solder materials directly disposed on the one or more interconnects to electrically couple the first substrate and the second substrate.

12. The method of claim 10, wherein the one or more interconnects have one or more different thicknesses or heights at different locations on the first substrate.

13. The method of claim 10, wherein the one or more interconnects are directly disposed on at least one of the top surface of the first substrate and one or more top surfaces of one or more dies on the first substrate, and wherein the one or more interconnects are directly disposed on the top surface of the first substrate and the one or more dies using a cold spray process.

14. The method of claim 10, wherein the one or more interconnects have one or more exposed top surfaces along a top surface of the mold layer.

15. The method of claim 10, further comprising one or more electrical components disposed on the first substrate, wherein each of the one or more electrical components has terminal edges electrically coupled to the interconnects, and wherein the one or more electrical components include capacitors, inductors, or resistors.

16. The method of claim 10, wherein the one or more interconnects include one or more different materials, including metals, metal alloys, and metal and ceramic composites.

17. The method of claim 10, wherein at least one of the one or more interconnects include at least one of one or more different shapes, including round interconnects, rectangular interconnects, and tapered interconnects, and wherein at least one of the one or more interconnects has multi-layers of one or more materials, including at least a first conductor material layer and a second semi-conductor material layer to form one or more bi-layers.

18. The method of claim 10, wherein at least one of the first substrate and the second substrate is a printed circuit board.

19. A device package, comprising:
    a first set of one or more dies disposed on a first substrate;
    a first set of interconnects vertically disposed on the first substrate or one or more top surfaces of the first set of dies;
    a first mold layer disposed over and around the first set of dies, the first set of interconnects, and the first substrate;
    a second set of one or more dies disposed on a second substrate;
    a second set of interconnects vertically disposed on the second substrate or one or more top surfaces of the second set of dies;
    a second mold layer disposed over and around the second set of dies, the second set of interconnects, and the second substrate; and
    a third set of one or more dies disposed on a third substrate, wherein the first substrate is electrically coupled to the second and third substrates with the first and second set of interconnects, and wherein the first and second set of interconnects are directly disposed on the top surfaces of the first and second substrates or the top surfaces of the first and second set of dies without an adhesive layer.

20. The device package of claim 19, further comprising:
    a first set of one or more solder materials directly disposed on the one or more of the first set of interconnects to electrically couple the first substrate and the second substrate; and a second set of one or more solder materials directly disposed on the one or more of the second set of interconnects to electrically couple the second substrate and the third substrate.

21. The device package of claim 19, wherein the first and second set of interconnects have one or more different thicknesses or heights at different locations on the first substrate and second substrates, wherein the first set of interconnects are directly disposed on at least one of the top surface of the first substrate and one or more top surfaces of one or more dies on the first substrate, wherein the second set of interconnects are directly disposed on at least one of the top surface of the second substrate and one or more top surfaces of one or more dies on the second substrate, and wherein the first and second set of interconnects are directly disposed on the top surface of the first substrate and second substrate and the one or more dies using a cold spray process.

22. The device package of claim 19, wherein the first and second set of interconnects have one or more exposed top surfaces along a top surface of the mold layer.

23. The device package of claim 19, further comprising one or more electrical components disposed on at least one of the first substrate and the second substrate, wherein each of the one or more electrical components has terminal edges electrically coupled to the interconnects, and wherein the one or more electrical components include capacitors, inductors, or resistors.

24. The device package of claim 19, wherein the first and second set of interconnects include one or more different materials, including metals, metal alloys, and metal and ceramic composites.

25. The device package of claim 19, wherein at least one of the first and second set of interconnects include at least one of one or more different shapes, including round interconnects, rectangular interconnects, and tapered interconnects, wherein at least one of the first and second set of interconnects has multi-layers of one or more materials, including at least a first conductor material layer and a second semi-conductor material layer to form one or more bi-layers, and wherein at least one of the first substrate, the second substrate, and the third substrate is a printed circuit board.

* * * * *